United States Patent
Lu

(10) Patent No.: US 11,232,984 B1
(45) Date of Patent: Jan. 25, 2022

(54) METHOD FOR PREPARING SEMICONDUCTOR DEVICE WITH COMPOSITE LANDING PAD

(71) Applicant: NANYA TECHNOLOGY CORPORATION, New Taipei (TW)

(72) Inventor: Li-Han Lu, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/020,083

(22) Filed: Sep. 14, 2020

(51) Int. Cl.
*H01L 21/768* (2006.01)
*H01L 27/108* (2006.01)

(52) U.S. Cl.
CPC .... *H01L 21/76889* (2013.01); *H01L 21/7684* (2013.01); *H01L 21/76843* (2013.01); *H01L 27/10888* (2013.01)

(58) Field of Classification Search
CPC ......... H01L 21/76889; H01L 21/76843; H01L 21/7684; H01L 21/76897; H01L 21/76895; H01L 27/1088
See application file for complete search history.

(56) References Cited

U.S. PATENT DOCUMENTS 6,153,517 A * 11/2000 Chuang ............. H01L 21/76843
257/E21.584

* cited by examiner

*Primary Examiner* — Thanhha S Pham
(74) *Attorney, Agent, or Firm* — Muncy, Geissler, Olds & Lowe, P.C.

(57) ABSTRACT

The present disclosure relates to a method for preparing a semiconductor device with a composite landing pad. The method includes forming a first dielectric layer over a semiconductor substrate. The method also includes forming a barrier layer and a first lower metal plug penetrating through the first dielectric layer and in a cell region. The first lower metal plug is surrounded by the barrier layer. The method further includes depositing a silicon layer over the first dielectric layer, the barrier layer and the first lower metal plug. In addition, the method includes performing a salicide process to form an inner silicide portion over the first lower metal plug and an outer silicide portion over the barrier layer after the silicon layer is formed. The inner silicide portion is surrounded by the outer silicide portion, and a recess is formed over the inner silicide portion.

14 Claims, 21 Drawing Sheets

METHOD FOR PREPARING SEMICONDUCTOR DEVICE WITH COMPOSITE LANDING PAD

TECHNICAL FIELD

The present disclosure relates to a method for preparing a semiconductor device with a composite landing pad.

DISCUSSION OF THE BACKGROUND

Semiconductor devices are essential for many modern applications. With the advancement of electronic technology, semiconductor devices are becoming smaller in size while providing greater functionality and including greater amounts of integrated circuitry. Due to the miniaturized scale of semiconductor devices, various types and dimensions of semiconductor devices providing different functionalities are integrated and packaged into a single module. Furthermore, numerous manufacturing operations are implemented for integration of various types of semiconductor devices.

However, the manufacturing and integration of semiconductor devices involve many complicated steps and operations. An increase in complexity of manufacturing and integration of the semiconductor device may cause deficiencies such as misalignment in interconnect structures. Accordingly, there is a continuous need to improve the structure and the manufacturing process of semiconductor devices.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a method for preparing a semiconductor device is provided. The method includes forming a first dielectric layer over a semiconductor substrate. The method also includes forming a barrier layer and a first lower metal plug penetrating through the first dielectric layer and in a cell region. The first lower metal plug is surrounded by the barrier layer. The method further includes depositing a silicon layer over the first dielectric layer, the barrier layer and the first lower metal plug. In addition, the method includes performing a salicide process to form an inner silicide portion over the first lower metal plug and an outer silicide portion over the barrier layer after the silicon layer is formed. The inner silicide portion is surrounded by the outer silicide portion, and a recess is formed over the inner silicide portion.

In an embodiment, the formation of the barrier layer and the first lower metal plug includes etching the first dielectric layer to form a first opening in the cell region, and forming a barrier material lining the first opening. The formation of the barrier layer and the first lower metal plug also includes forming a first metal material over the barrier material, and planarizing the first metal material and the barrier material to form the first lower metal plug and the barrier layer in the first opening. In an embodiment, the method further includes partially removing the first dielectric layer to expose an upper sidewall of the barrier layer before the silicon layer is deposited. In an embodiment, the upper sidewall of the barrier layer is covered by the silicon layer before the salicide process is performed.

In an embodiment, the method further includes etching the first dielectric layer to form a second opening in a peripheral circuit region, wherein a top surface of the semiconductor substrate is exposed by the second opening. In addition, the method includes forming a second metal material lining the second opening and covering the top surface of the semiconductor substrate, forming a dielectric material over the second metal material, and planarizing the second metal material and the dielectric material to form a second lower metal plug and a dielectric pillar surrounded by the second lower metal plug. In an embodiment, the method further includes forming a second dielectric layer over the first dielectric layer, forming a first upper metal plug penetrating through the second dielectric layer and contacting the inner silicide portion and the outer silicide portion, and forming a second upper metal plug penetrating through the second dielectric layer and contacting the second lower metal plug and the dielectric pillar. In an embodiment, the method further includes partially removing the second metal material to expose a portion of the top surface of the semiconductor substrate before the dielectric material is formed.

In an embodiment, the barrier layer is made of a titanium-containing material, and the outer silicide portion is made of a titanium-containing silicide.

In an embodiment, the first lower metal plug and the barrier layer protrude from a top surface of the first dielectric layer, and an upper sidewall of the barrier layer is covered by the outer silicide portion.

In an embodiment, the top surface of the inner silicide portion is in direct contact with a bottom surface of the first upper metal plug.

In an embodiment, the top surface of the outer silicide portion is in direct contact with a sidewall of the first upper metal plug.

In an embodiment, a sidewall of the upper metal plug is partially covered by the outer silicide portion.

In an embodiment, the dielectric pillar is separated from the semiconductor substrate by the second lower metal plug.

In an embodiment, the dielectric pillar is in direct contact with the semiconductor substrate.

Embodiments of a method for preparing a semiconductor device is provided in the disclosure. In some embodiments, the semiconductor device includes a lower metal plug and a barrier layer disposed over a semiconductor substrate, and the lower metal plug is surrounded by the barrier layer. The semiconductor device also includes an inner silicide portion disposed over the lower metal plug and an outer silicide portion disposed over the barrier layer. The inner silicide portion and the outer silicide portion constitute a composite landing pad with an increased landing area for an upper metal plug to land on. Therefore, the contact resistance may be reduced, and the misalignment issues between the lower metal plug and the upper metal plug may be prevented or reduced. As a result, the overall device performance may be improved, and the yield rate of the semiconductor device may be increased.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 13 is a cross-sectional view along the sectional line I-I' in FIG. 14.

DETAILED DESCRIPTION

Figure 1:
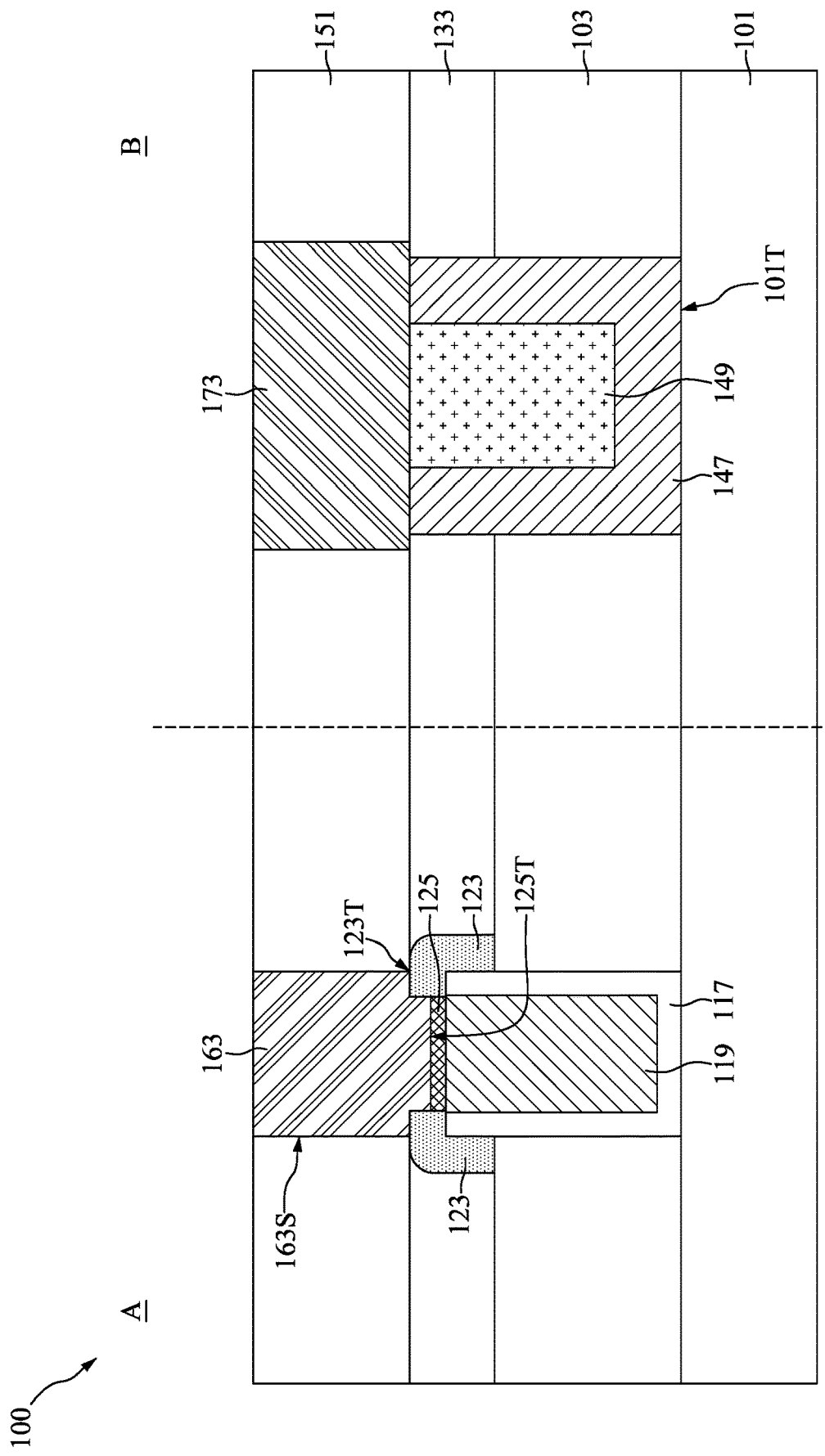
FIG. 1 is a cross-sectional view illustrating a semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s)

as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a cross-sectional view illustrating a semiconductor device 100, in accordance with some embodiments. As shown in FIG. 1, the semiconductor device 100 includes a semiconductor substrate 101, a first dielectric layer 103 disposed over the semiconductor substrate 101, a patterned mask 133 disposed over the first dielectric layer 103, and a second dielectric layer 151 disposed over the patterned mask 133.

In some embodiments, isolation structures (not shown) are disposed in the semiconductor substrate 101, and active areas (not shown) are defined by the isolation structures. Each of the active areas may include source/drain (S/D) regions. In some embodiments, the semiconductor device 100 includes a cell region A and a peripheral circuit region B adjacent to the cell region A. The cell region A is also referred to herein as a pattern-dense region, and the peripheral circuit region B is also referred to as herein as a pattern-loose region.

In the cell region A, the semiconductor device 100 includes a barrier layer 117 and a lower metal plug 119 (also referred to as a first lower metal plug) disposed in the first dielectric layer 103. In some embodiments, the barrier layer 117 and the lower metal plug 119 penetrate through the first dielectric layer 103. In some embodiments, the barrier layer 117 and the lower metal plug 119 protrude from the first dielectric layer 103. Specifically, the upper portion of the barrier layer 117 and the upper portion of the lower metal plug 119 are disposed in the patterned mask 133. Moreover, in some embodiments, the barrier layer 117 surrounds the lower metal plug 119. Specifically, the lower metal plug 119 is separated from the first dielectric layer 103 by the barrier layer 117.

The semiconductor device 100 also includes an inner silicide portion 125 and an outer silicide portion 123 disposed in the patterned mask 133. In some embodiments, the inner silicide portion 125 is disposed over the lower metal plug 119, and the outer silicide portion 123 is disposed over the barrier layer 117. It should be noted that the top surface 123T of the outer silicide portion 123 is higher than the top surface 125T of the inner silicide portion 125, in accordance with some embodiments. In some embodiments, the top surface 123T of the outer silicide portion 123 is the topmost surface of the outer silicide portion 123, and the top surface 125T of the inner silicide portion 125 is the topmost surface of the inner silicide portion 125.

In the cell region A, the semiconductor device 100 further includes an upper metal plug 163 (also referred to as a first upper metal plug) disposed in the second dielectric layer 151. In some embodiments, the upper metal plug 163 is in direct contact with the inner silicide portion 125 and the outer silicide portion 123. It should be noted that the sidewall 163S of the upper metal plug 163 is partially covered by the outer silicide portion 123, in accordance with some embodiments. In some embodiments, the upper metal plug 163 is electrically connected to the lower metal plug 119 through the inner silicide portion 125 and the outer silicide portion 123.

In the peripheral circuit region B, the semiconductor device 100 includes a lower metal plug 147 (also referred to as a second lower metal plug) and a dielectric pillar 149 disposed in the first dielectric layer 103 and the patterned mask 133. In some embodiments, the dielectric pillar 149 is surrounded by the lower metal plug 147. Specifically, the dielectric pillar 149 is separated from the first dielectric layer 103 by the lower metal plug 147.

The semiconductor device 100 also includes an upper metal plug 173 (also referred to as a second upper metal plug) disposed in the peripheral circuit region B. In some embodiments, the upper metal plug 173 is disposed in the second dielectric layer 151. In some embodiments, the upper metal plug 173 is in direct contact with the lower metal plug 147 and the dielectric pillar 149. Moreover, the upper metal plug 173 is electrically connected to the lower metal plug 147, in accordance with some embodiments.

The inner silicide portion 125 and the outer silicide portion 123 may constitute a composite landing pad in the cell region A of the semiconductor device 100. In some embodiments, the semiconductor device 100 is a dynamic random access memory (DRAM), and the composite landing pad serves as a bit line (BL) landing pad or a storage node landing pad for the DRAM. Since the composite landing pad provides an increased landing area for the upper metal plug 163 to land on, the contact resistance may be reduced, and the misalignment issues between the lower metal plug 119 and the upper metal plug 163 may be prevented or reduced. As a result, the overall device performance may be improved, and the yield rate of the semiconductor device 100 may be increased.

Figure 2:
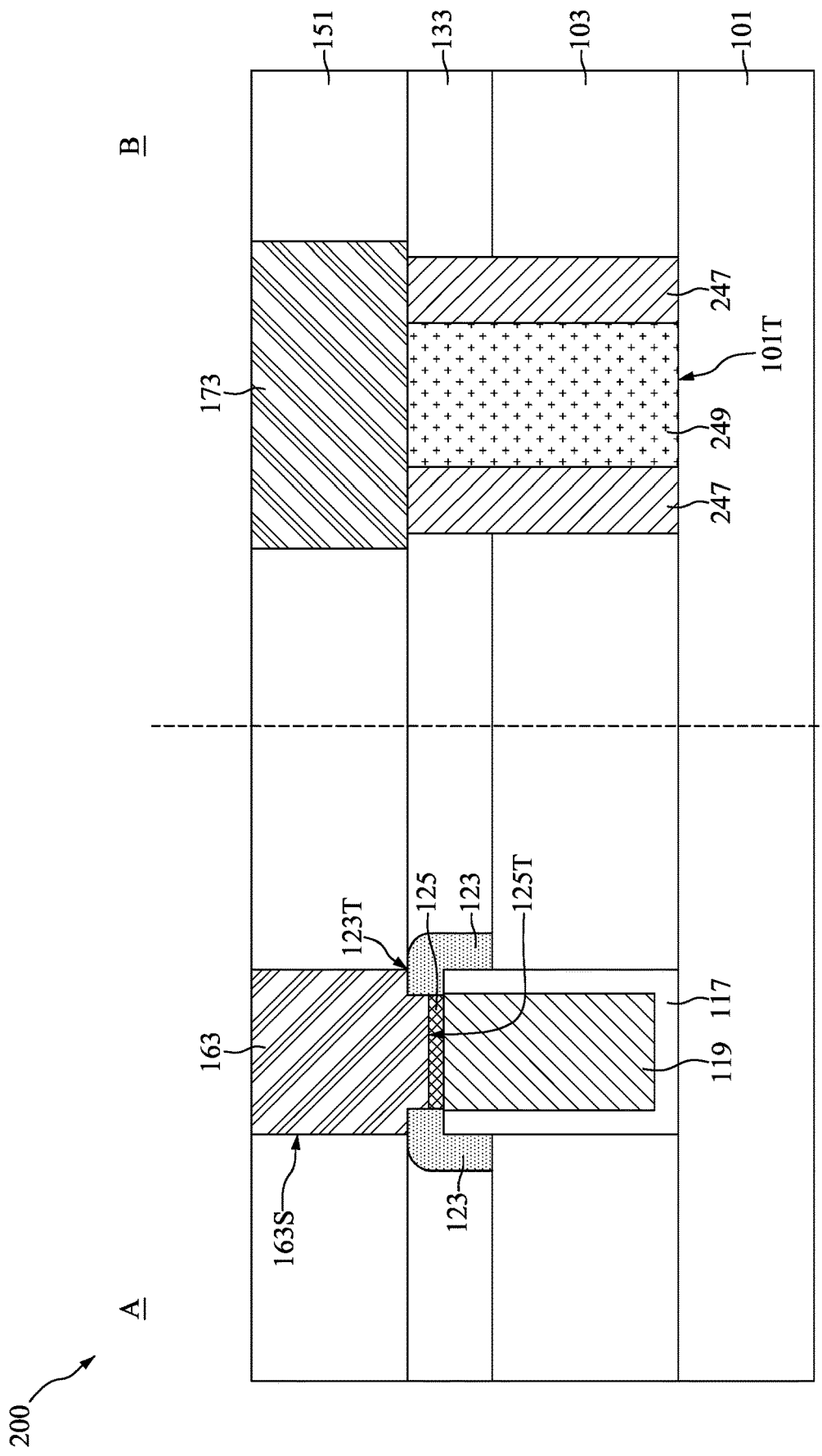
FIG. 2 is a cross-sectional view illustrating a modified semiconductor device, in accordance with some embodiments.

FIG. 2 is a cross-sectional view illustrating a modified semiconductor device 200, which is an alternative embodiment of the semiconductor device 100, in accordance with some embodiments. For reasons of consistency and clarity, similar components appearing in both FIGS. 1 and 2 will be labeled the same.

Similar to the semiconductor device 100, the modified semiconductor device 200 includes a cell region A and a peripheral circuit region B. A difference is that the dielectric pillar 249 in the peripheral circuit region B of the modified semiconductor device 200 is in direct contact with the semiconductor substrate 101. In other words, instead of forming a cup shaped metal structure (i.e., the lower metal plug 147 of FIG. 1), a spacer shaped metal structure, such as the lower metal plug 247 is formed in the modified semiconductor device 200.

Similar to the semiconductor device 100, the inner silicide portion 125 and the outer silicide portion 123 of the modified semiconductor device 200 may constitute a composite landing pad in the cell region A. In some embodiments, the modified semiconductor device 200 is a dynamic random access memory (DRAM), and the composite landing pad serves as a BL landing pad or a storage node landing pad for the DRAM.

Figure 3:
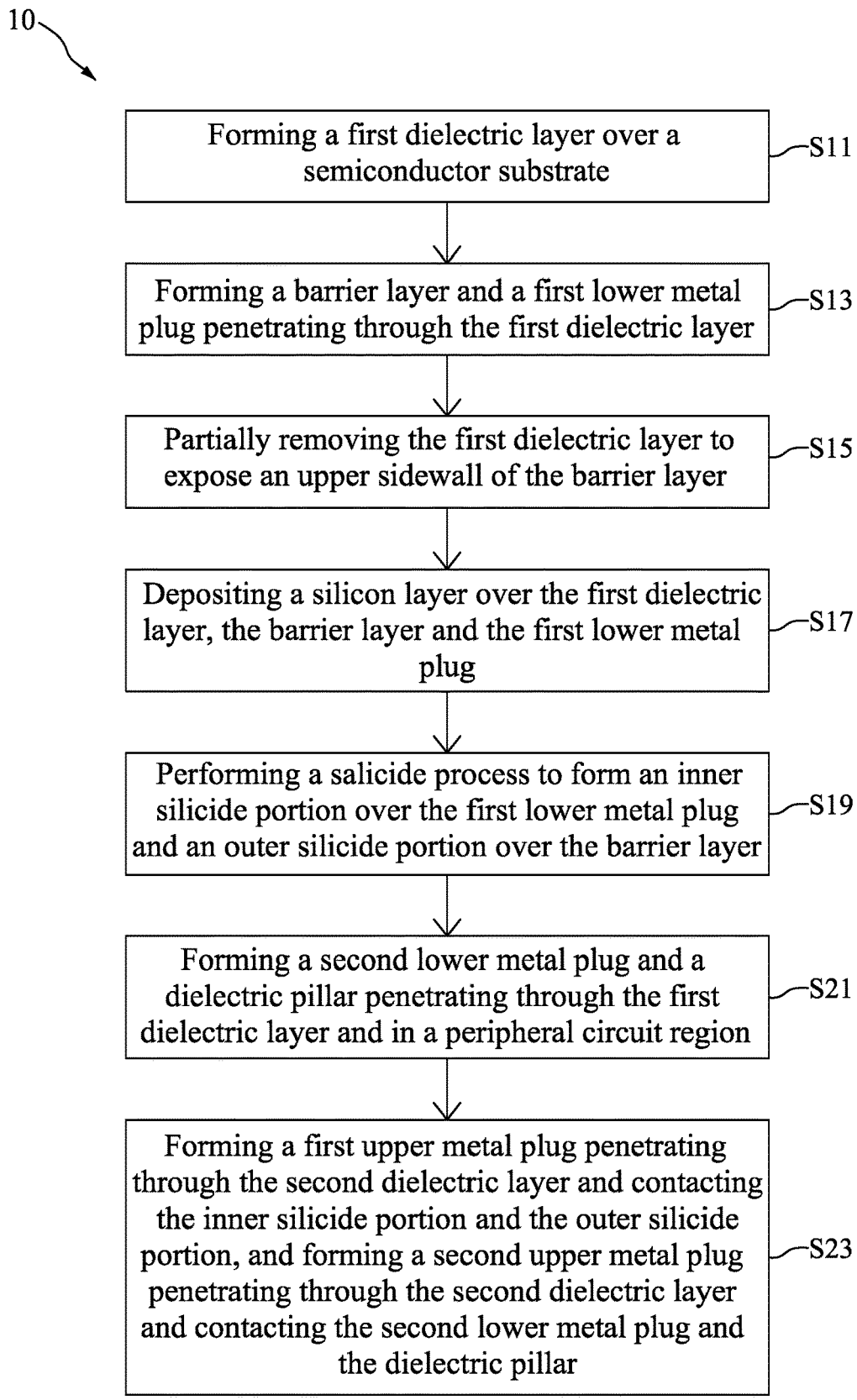
FIG. 3 is a flow diagram illustrating a method for preparing a semiconductor device, in accordance with some embodiments.

FIG. 3 is a flow diagram illustrating a method 10 of forming a semiconductor device (including the semiconductor device 100 and the modified semiconductor device 200), and the method 10 includes steps S11, S13, S15, S17, S19, S21 and S23, in accordance with some embodiments. The steps S11 to S23 of FIG. 3 are elaborated in connection with the following figures.

Figure 4:
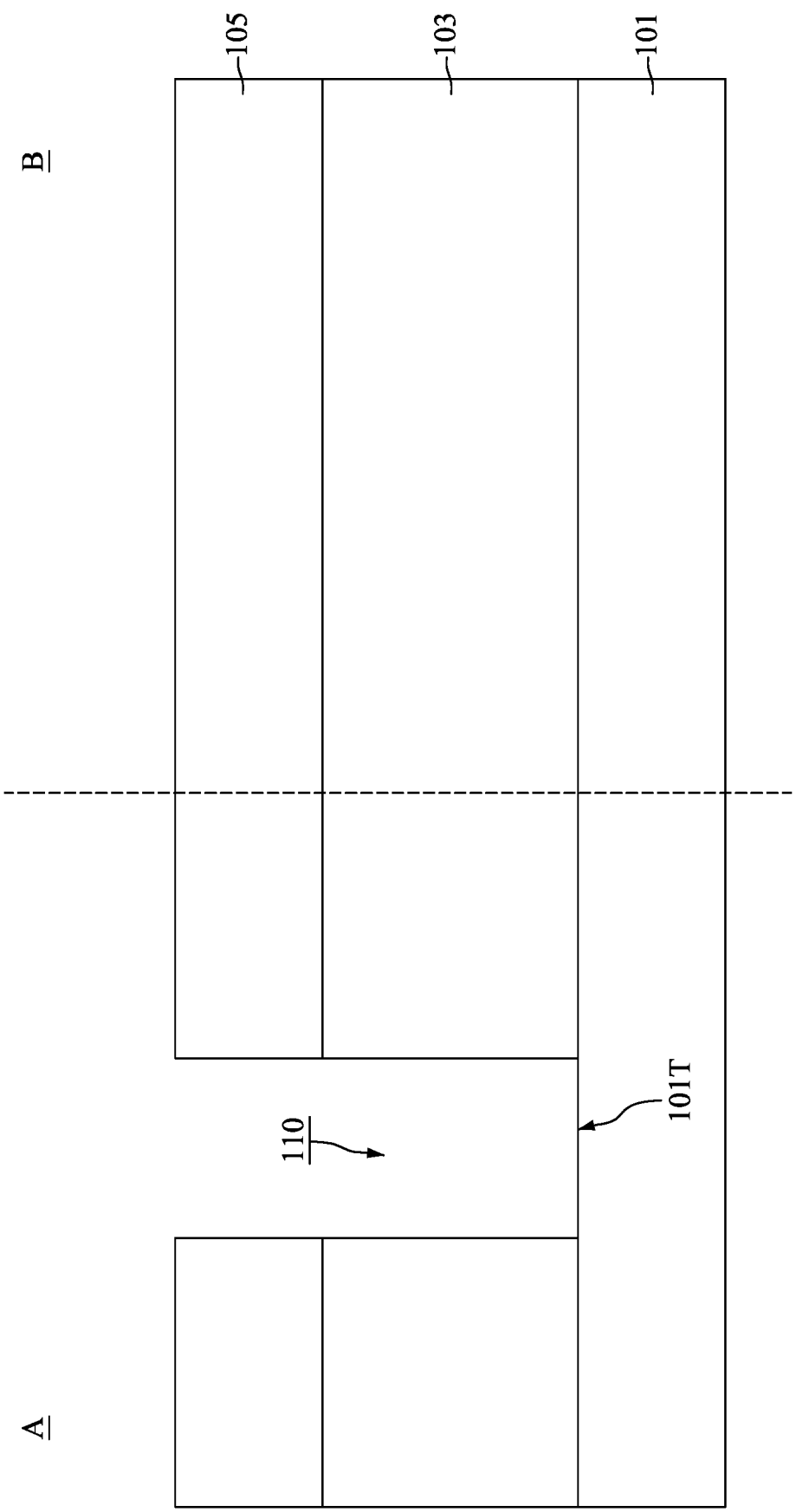
FIG. 4 is a cross-sectional view illustrating an intermediate stage of partially removing a first dielectric layer to form an opening in a cell region during the formation of the semiconductor device, in accordance with some embodiments.
Figure 13:
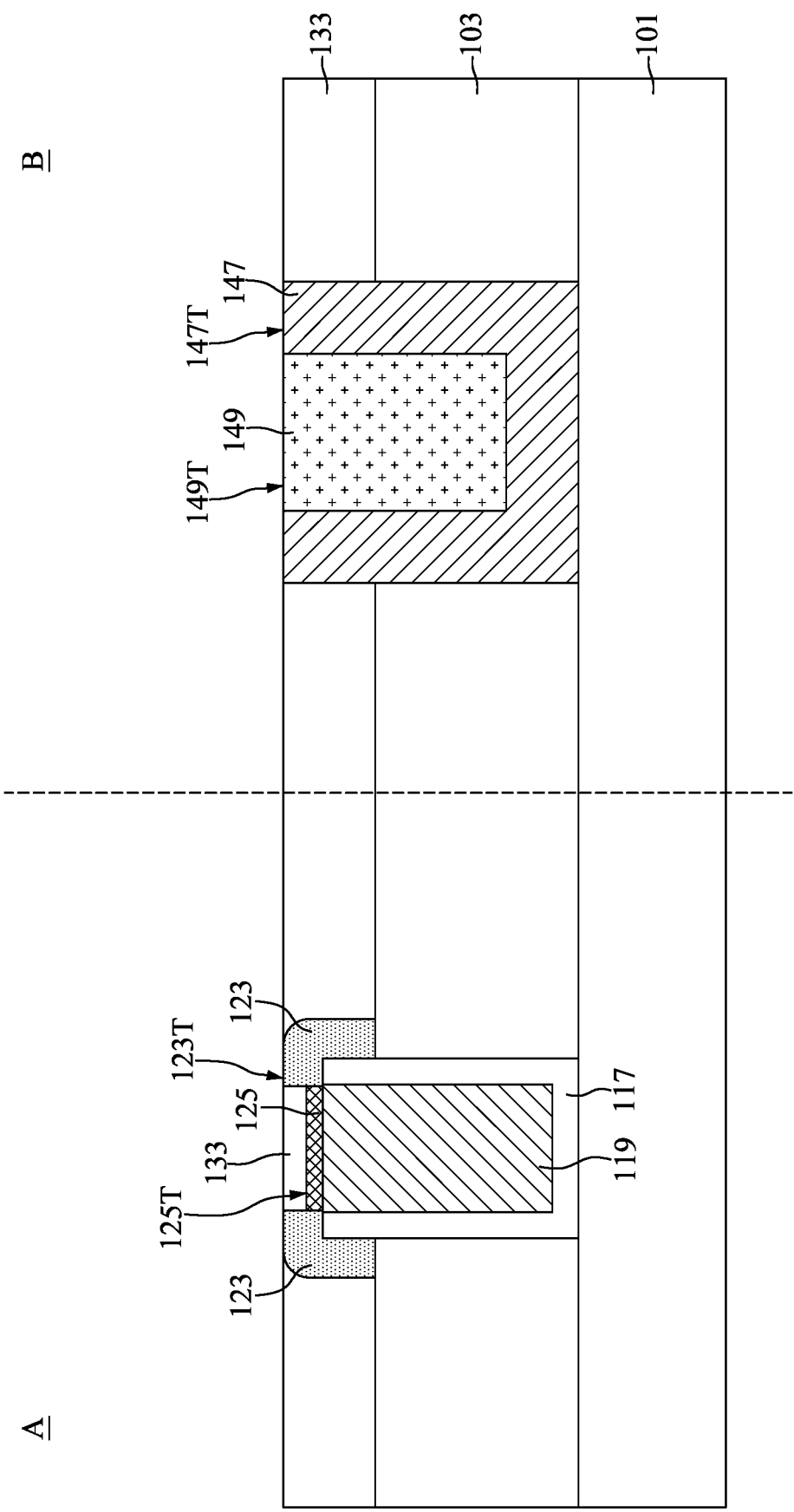
FIG. 13 is a cross-sectional view illustrating an intermediate stage of forming a lower metal plug and a dielectric pillar in the opening of the peripheral circuit region during the formation of the semiconductor device, in accordance with some embodiments.
Figure 14:
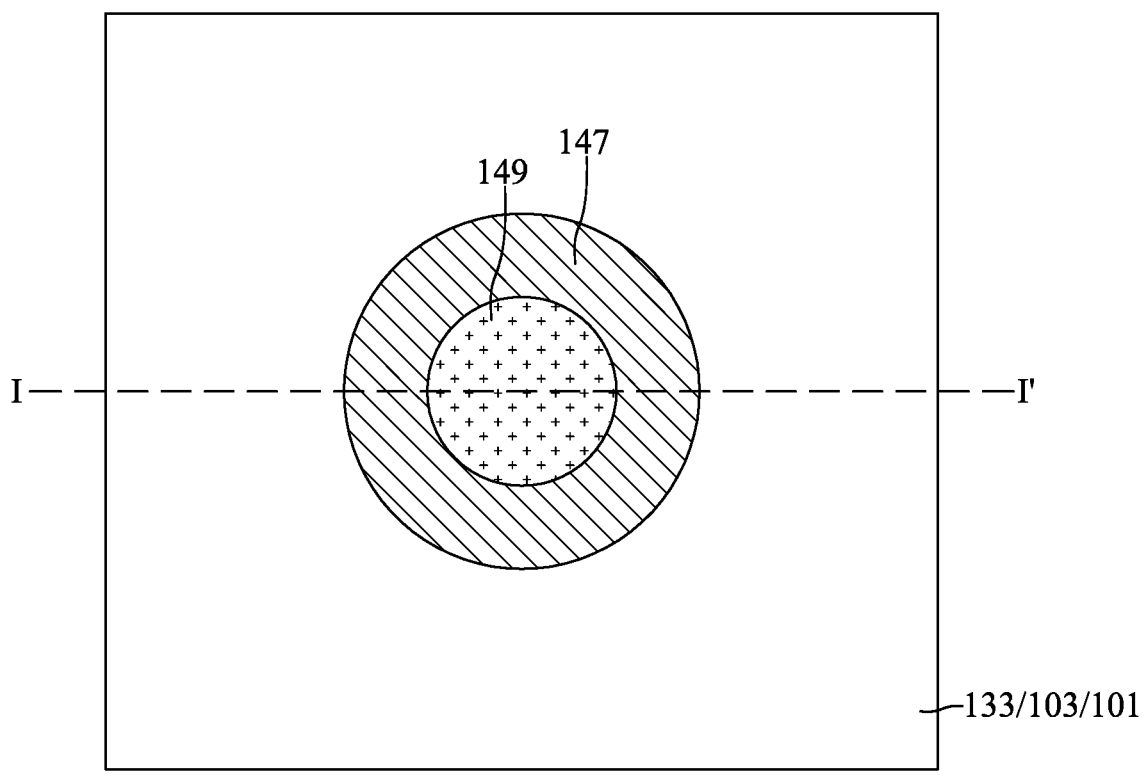
FIG. 14 is a top view illustrating an intermediate stage of forming a lower metal plug and a dielectric pillar in the opening of the peripheral circuit region during the formation of the semiconductor device, in accordance with some embodiments.

FIGS. 4 to 13 and FIGS. 15 to 17 are cross-sectional views illustrating intermediate stages of forming the semiconductor device 100, and FIG. 14 is a top view illustrating an intermediate stage of forming the semiconductor device 100, in accordance with some embodiments. As shown in FIG. 4, the semiconductor substrate 101 is provided. The semiconductor substrate 101 may be a semiconductor wafer such as a silicon wafer.

Alternatively or additionally, the semiconductor substrate 101 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP.

In some embodiments, the semiconductor substrate 101 includes an epitaxial layer. For example, the semiconductor substrate 101 has an epitaxial layer overlying a bulk semiconductor. In some embodiments, the semiconductor substrate 101 is a semiconductor-on-insulator substrate which may include a substrate, a buried oxide layer over the substrate, and a semiconductor layer over the buried oxide layer, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other applicable methods.

Still referring to FIG. 4, the first dielectric layer 103 is formed over the semiconductor substrate 101, and a patterned mask 105 is formed over the first dielectric layer 103, in accordance with some embodiments. The respective step is illustrated as the step S11 in the method 10 shown in FIG. 3. In some embodiments, the first dielectric layer 103 is made of silicon oxide, silicon nitride, silicon oxynitride, or another applicable dielectric material. In addition, the first dielectric layer 103 may be formed by a chemical vapor deposition (CVD) process, a physical vapor deposition (PVD) process, an atomic layer deposition (ALD) process, a spin-on coating process, or another applicable process.

In some embodiments, the first dielectric layer 103 is etched by using the patterned mask 105 as a mask, such that an opening 110 is formed penetrating through the first dielectric layer 103 in the cell region A. In other words, a portion of the top surface 101T of the semiconductor substrate 101 in the cell region A is exposed by the opening 110. The opening 110 may be formed by a wet etching process, a dry etching process, or a combination thereof. As mentioned above, isolation structures and S/D regions may be formed in the semiconductor substrate 101. In these cases, one of the S/D regions may be exposed by the opening 110.

Figure 5:
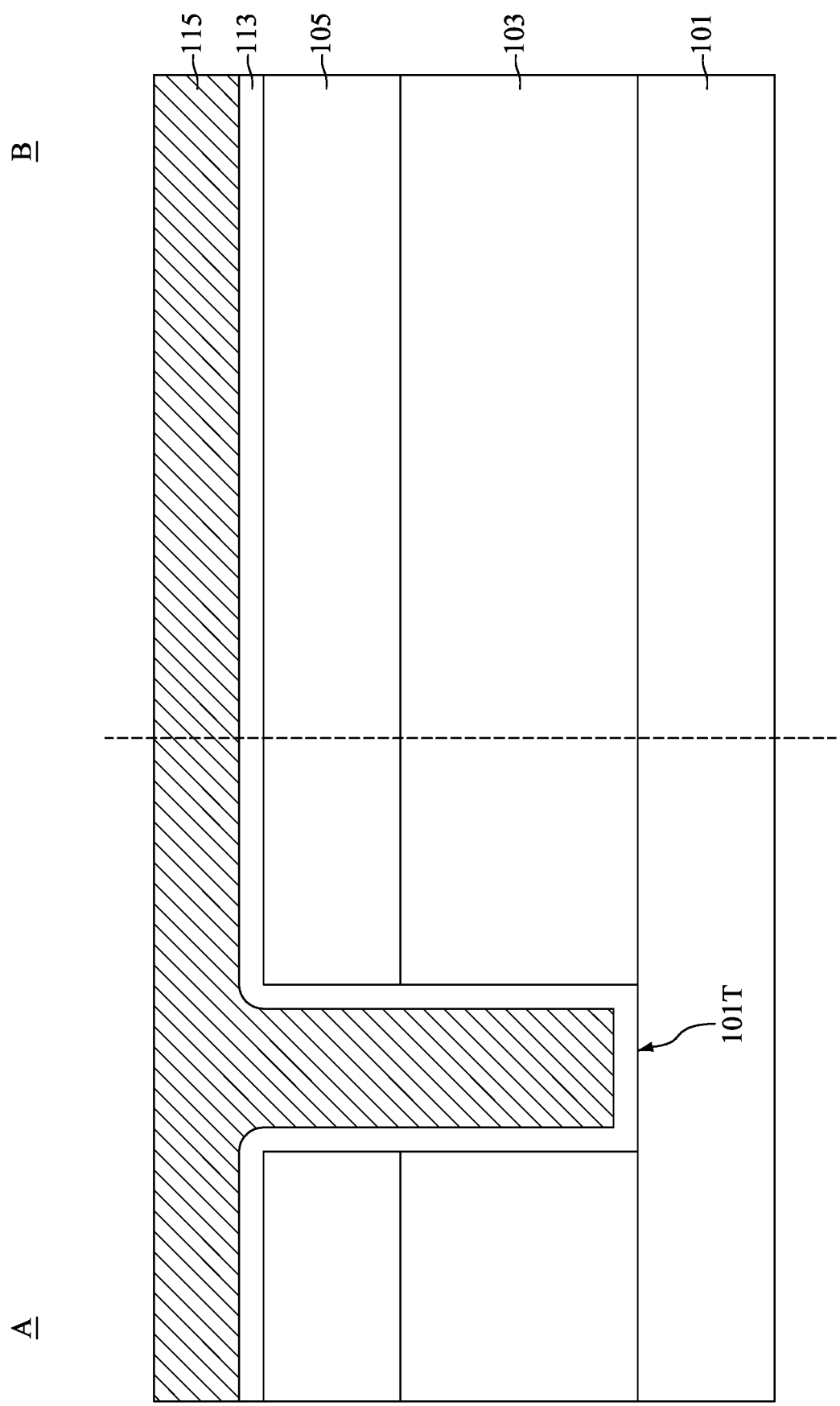
FIG. 5 is a cross-sectional view illustrating an intermediate stage of forming a barrier material and a metal material in the opening of the cell region during the formation of the semiconductor device, in accordance with some embodiments.

Next, a barrier material 113 is formed lining the opening 110, and a metal material 115 is formed over the barrier material 113 and filling the remaining portion of the opening 110, as shown in FIG. 5 in accordance with some embodiments. In some embodiments, the barrier material 113 is formed to cover the portion of the top surface 101T of the semiconductor substrate 101 exposed by the opening 110, the sidewalls of the opening 110, and the top surface of the patterned mask 105 (If the patterned mask 105 is removed after the opening 110 is formed, the barrier material 113 may be formed to cover the top surface of the first dielectric layer 103).

In some embodiments, the barrier material 113 is made of a titanium-containing material, such as titanium (Ti) or titanium nitride (TiN). However, other materials, such as tantalum (Ta), tantalum nitride (TaN), cobalt tungsten (CoW), or a combination thereof may alternatively be used. Moreover, the barrier material 113 may be formed by a CVD process, a PVD process, an ALD process, a metal organic chemical vapor deposition (MOCVD) process, a sputtering process, a plating process, or another applicable process.

In some embodiments, the metal material 115 is made of tungsten (W), aluminum (Al), copper (Cu), titanium (Ti), tantalum (Ta), a combination thereof, or another applicable metal material. Moreover, the metal material 115 may be formed by a CVD process, a PVD process, an ALD process, an MOCVD process, a sputtering process, a plating process, or another applicable process. It some embodiments, the barrier material 113 and the metal material 115 are made of different materials.

Figure 6:
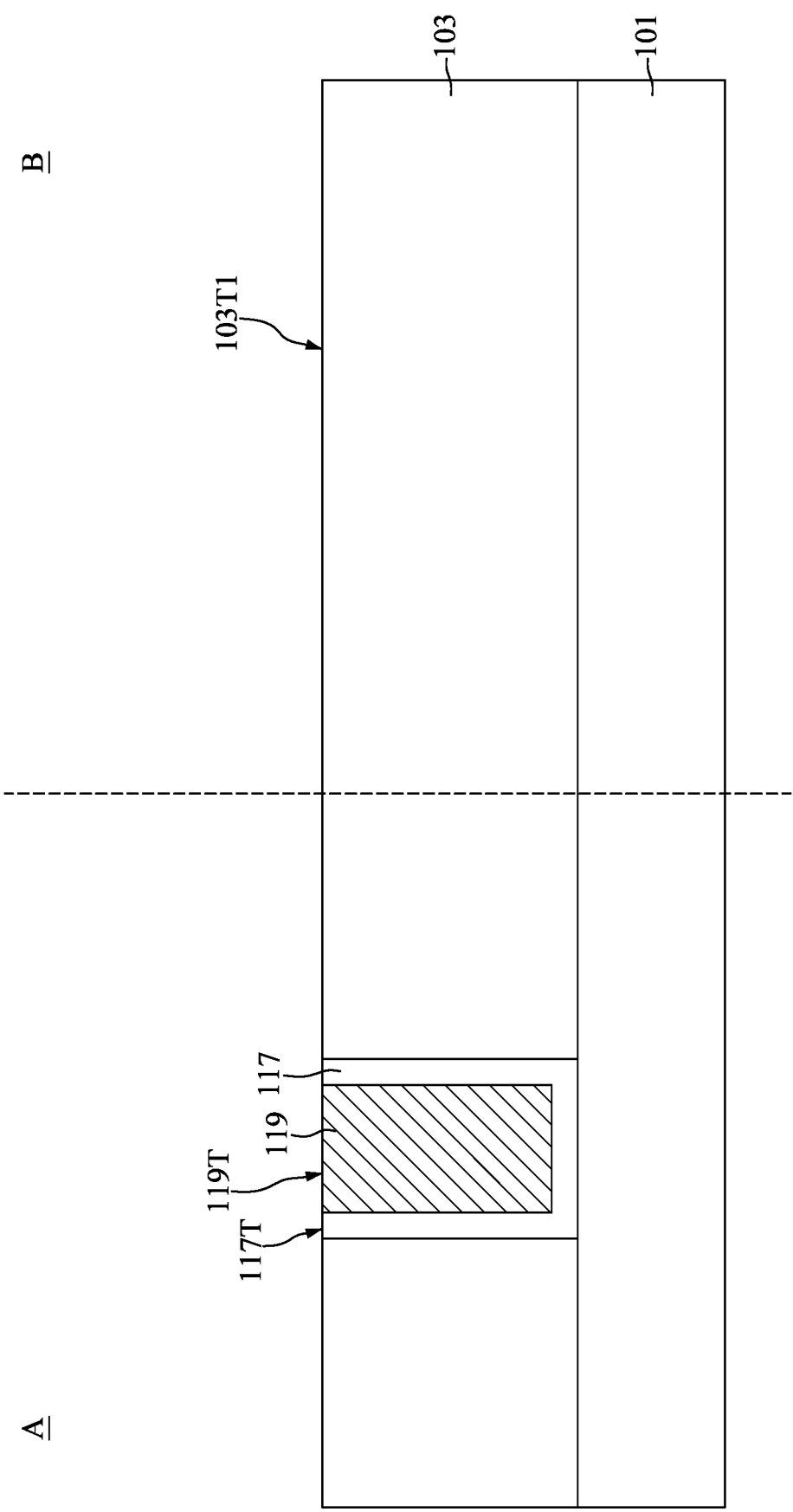
FIG. 6 is a cross-sectional view illustrating an intermediate stage of forming a barrier layer and a lower metal plug in the opening of the cell region during the formation of the semiconductor device, in accordance with some embodiments.

Subsequently, a planarization process is performed on the metal material 115 and the barrier material 113 to form the lower metal plug 119 and the barrier layer 117 in the opening 110 (See FIG. 4) of the cell region A, as shown in FIG. 6 in accordance with some embodiments. The respective step is illustrated as the step S13 in the method 10 shown in FIG. 3. The planarization process may include a chemical mechanical planarization (CMP) process, which removes the patterned mask 105, and the excess portions of the barrier material 113 and the metal material 115 over the first dielectric layer 103.

In some embodiments, the barrier layer 117 covers the sidewalls and the bottom surface of the lower metal plug 119. In some embodiments, the top surface 119T of the lower metal plug 119, the top surface 117T of the barrier layer 117 and the top surface 103T1 of the first dielectric layer 103 are substantially coplanar with each other. Within the context of this disclosure, the word "substantially" means preferably at least 90%, more preferably 95%, even more preferably 98%, and most preferably 99%.

Figure 7:
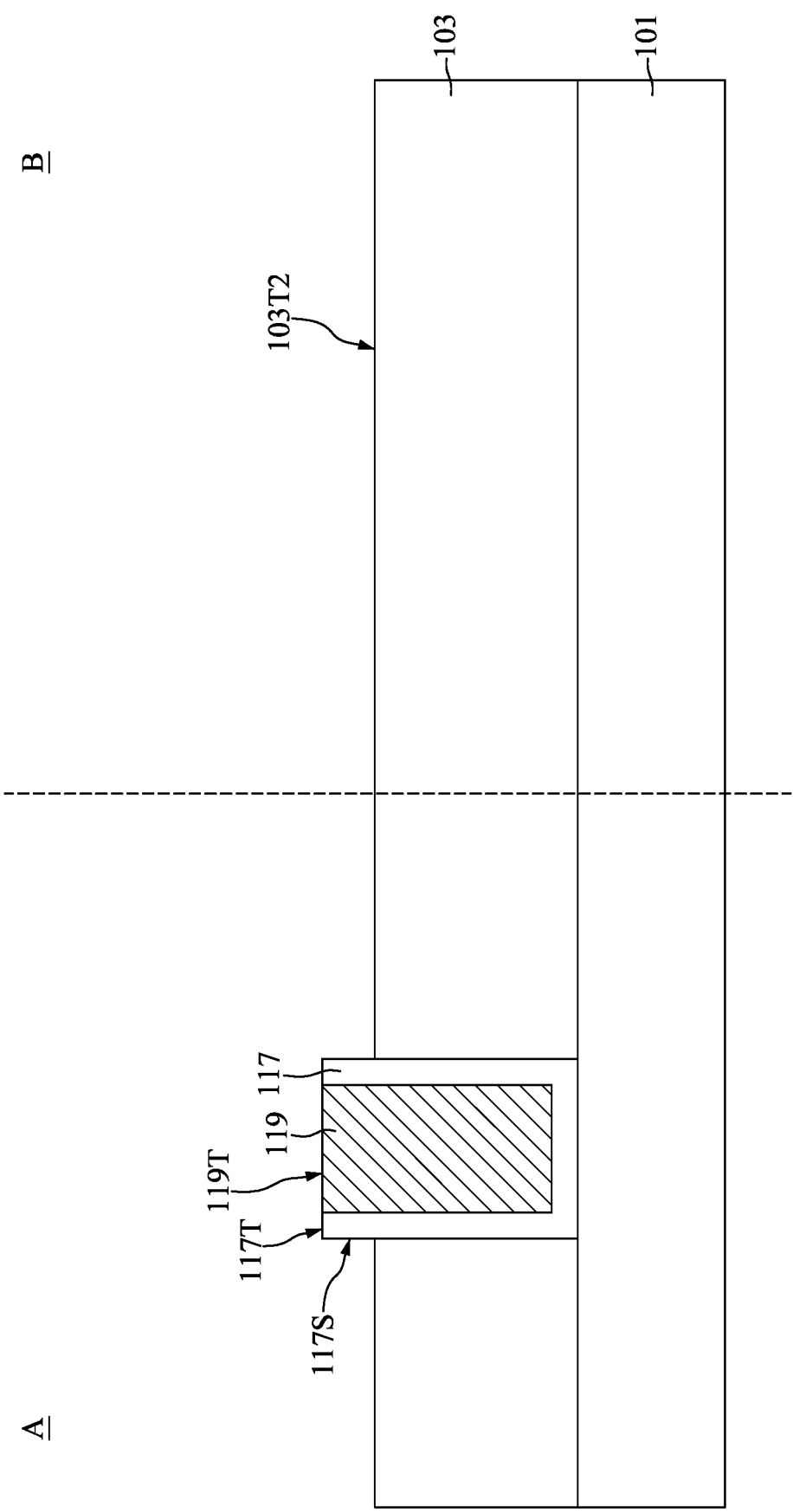
FIG. 7 is a cross-sectional view illustrating an intermediate stage of partially removing the first dielectric layer during the formation of the semiconductor device, in accordance with some embodiments.

Next, the first dielectric layer 103 is partially removed to expose the upper sidewalls 117S of the barrier layer 117, as shown in FIG. 7 in accordance with some embodiments. The respective step is illustrated as the step S15 in the method 10 shown in FIG. 3. In some embodiments, the first dielectric layer 103 is partially removed to form a lowered top surface 103T2 shown in FIG. 7. In some embodiments, the top surface 117T of the barrier layer 117 and the top surface 119T of the lower metal plug 119 are higher than the top surface 103T2 of the first dielectric layer 103.

In some embodiments, the first dielectric layer 103 is partially removed by an etch-back process. In some embodiments, the first dielectric layer 103 is partially removed by a planarization process, such as CMP. In some embodiments, after the partial removal of the first dielectric layer 103, the barrier layer 117 and the lower metal plug 119 protrude from the first dielectric layer 103. In some embodiments, after the partial removal of the first dielectric layer 103, the top surface 117T of the barrier layer 117 is still substantially coplanar with the top surface 119T of the lower metal plug 119.

Figure 8:
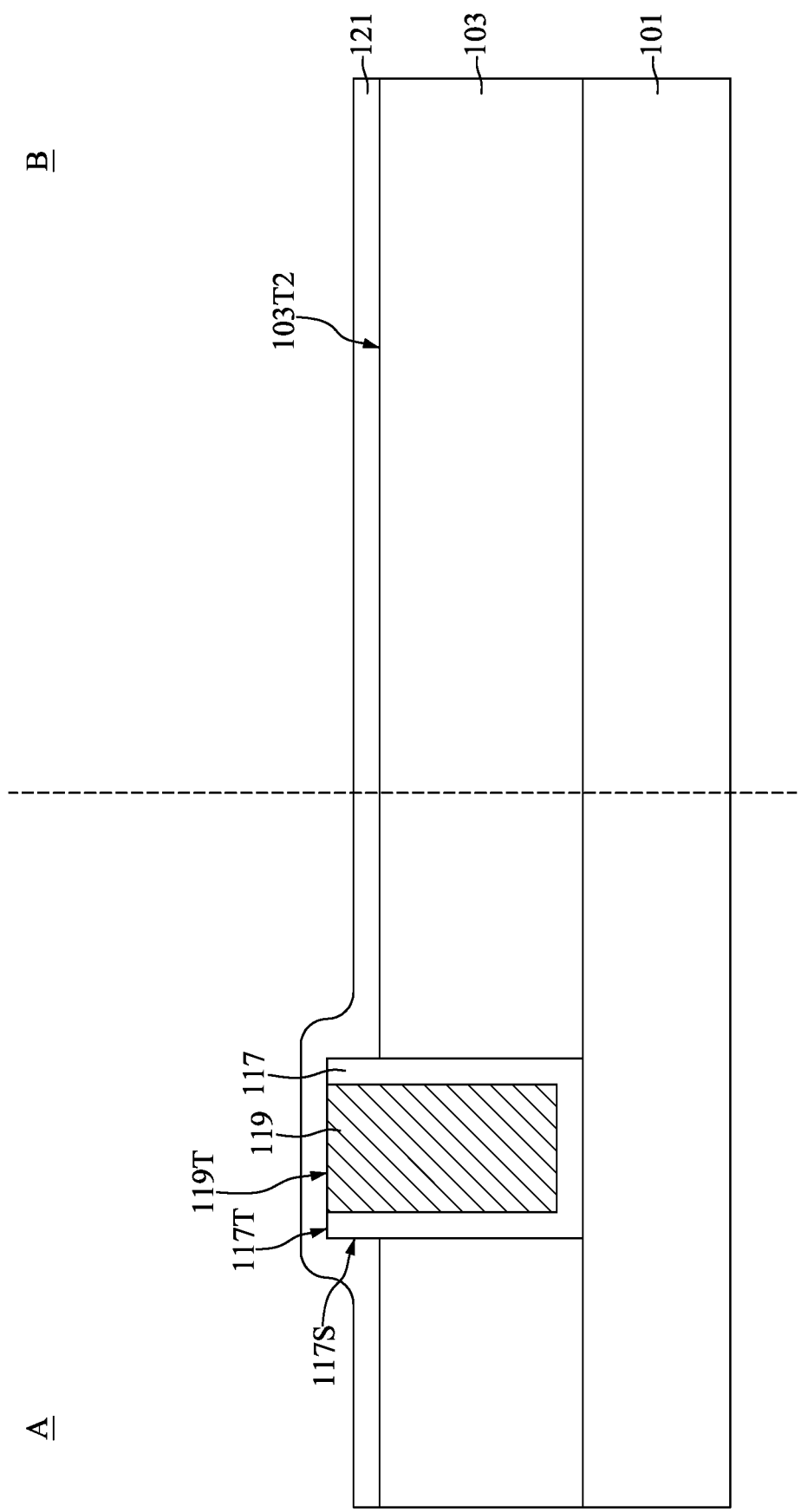
FIG. 8 is a cross-sectional view illustrating an intermediate stage of depositing a silicon layer during the formation of the semiconductor device, in accordance with some embodiments.

After the first dielectric layer 103 is partially removed, a silicon layer 121 is conformally deposited over and in direct contact with the first dielectric layer 103, the barrier layer 117 and the lower metal plug 119, as shown in FIG. 8 in accordance with some embodiments. The respective step is illustrated as the step S17 in the method 10 shown in FIG. 3. In some embodiments, the top surface 103T2 of the first dielectric layer 103, the upper sidewalls 117S and the top surface 117T of the barrier layer 117, and the top surface 119T of the lower metal plug 119 are covered by the silicon layer 121. In some embodiments, the silicon layer 121 is formed by a CVD process, a PVD process, an ALD process, a spin-on coating process, or another applicable process.

Figure 9:
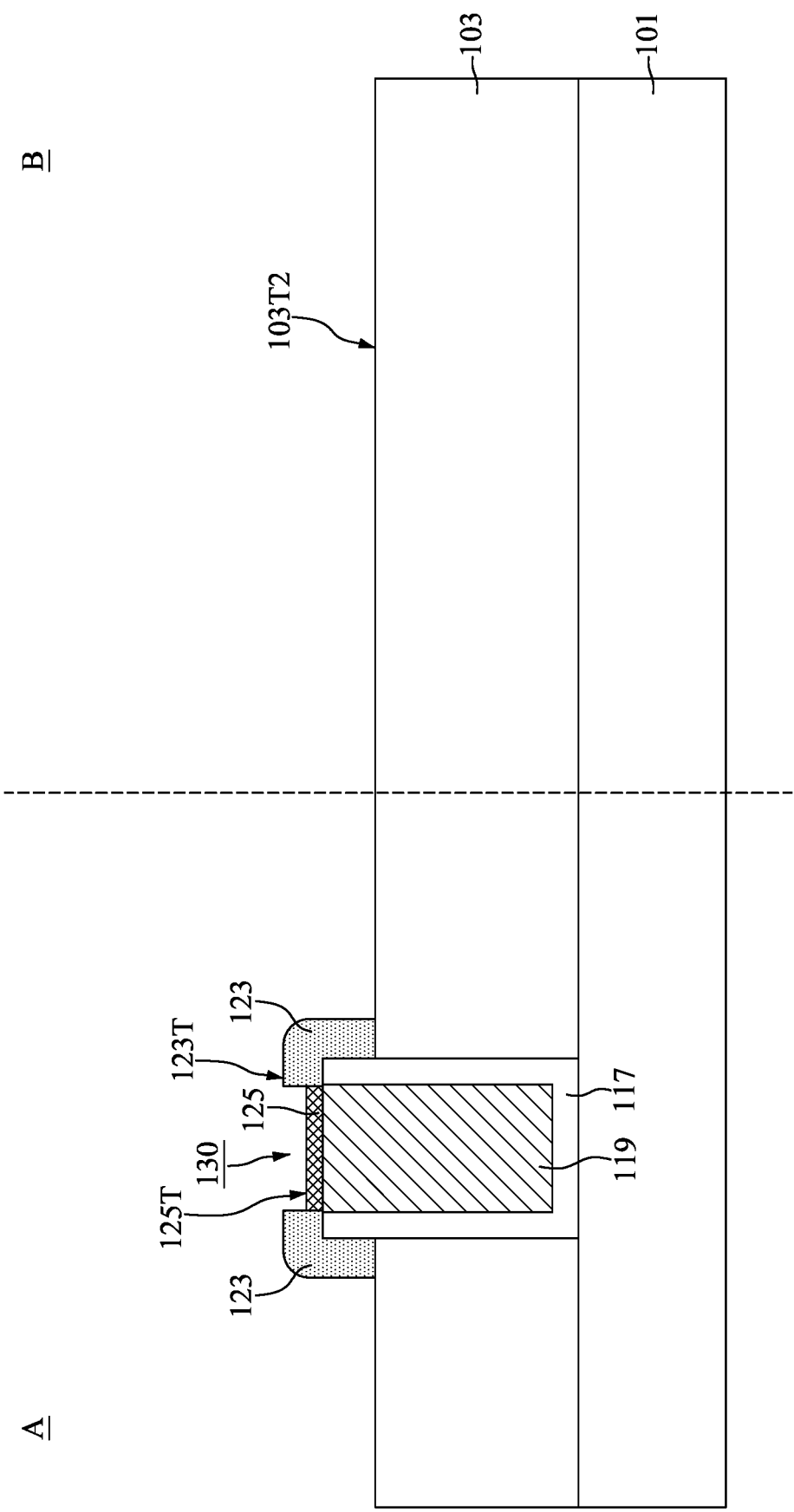
FIG. 9 is a cross-sectional view illustrating an intermediate stage of forming an inner silicide portion and an outer silicide portion during the formation of the semiconductor device, in accordance with some embodiments.

After the silicon layer 121 is deposited, a salicide (i.e., self-aligned silicide) process is performed to form the inner silicide portion 125 over the lower metal plug 119 and the outer silicide portion 123 over the barrier layer 127, as shown in FIG. 9 in accordance with some embodiments. The respective step is illustrated as the step S19 in the method 10 shown in FIG. 3.

In the present embodiment, the salicide process is performed to grow silicides on any exposed metal-based surface. In more detail, in the embodiment shown, the inner silicide portion 125 and the outer silicide portion 123 are formed by reacting the barrier layer 117 and the lower metal plug 119 with the silicon layer 121, annealing and etching to remove the unreacted portions of the silicon layer 121. Referring to FIGS. 8 and 9, the inner silicide portion 125 is grown on the top surface 119T of the lower metal plug 119, and the outer silicide portion 123 is grown on the top surface 117T and the upper sidewalls 117S of the barrier layer 117, in accordance with some embodiments.

Moreover, the materials of the barrier layer 117 and the lower metal plug 119 are selected such that the barrier layer 117 exhibits a greater silicidation rate than the lower metal plug 119. Therefore, the outer silicide portion 123 is grown faster than the inner silicide portion 125. In some embodiments, after the salicide process, the top surface 123T of the outer silicide portion 123 is greater than the top surface 125T of the inner silicide portion 125. In some embodiments, the barrier material 113 is made of a titanium-containing material, and the outer silicide portion 123 is made of a titanium-containing silicide.

In some embodiments, the inner silicide portion 125 is surrounded by the outer silicide portion 123, and a recess 130 is formed over the inner silicide portion 125 and surrounded by the outer silicide portion 123. In addition, the outer silicide portion 123 is in direct contact with the top surface 103T2 of the first dielectric layer 103, in accordance with some embodiments. Since the inner silicide portion 125 and the outer silicide portion 123 are formed by the salicide (self-aligned silicide) process, the associated costs may be reduced.

Figure 10:
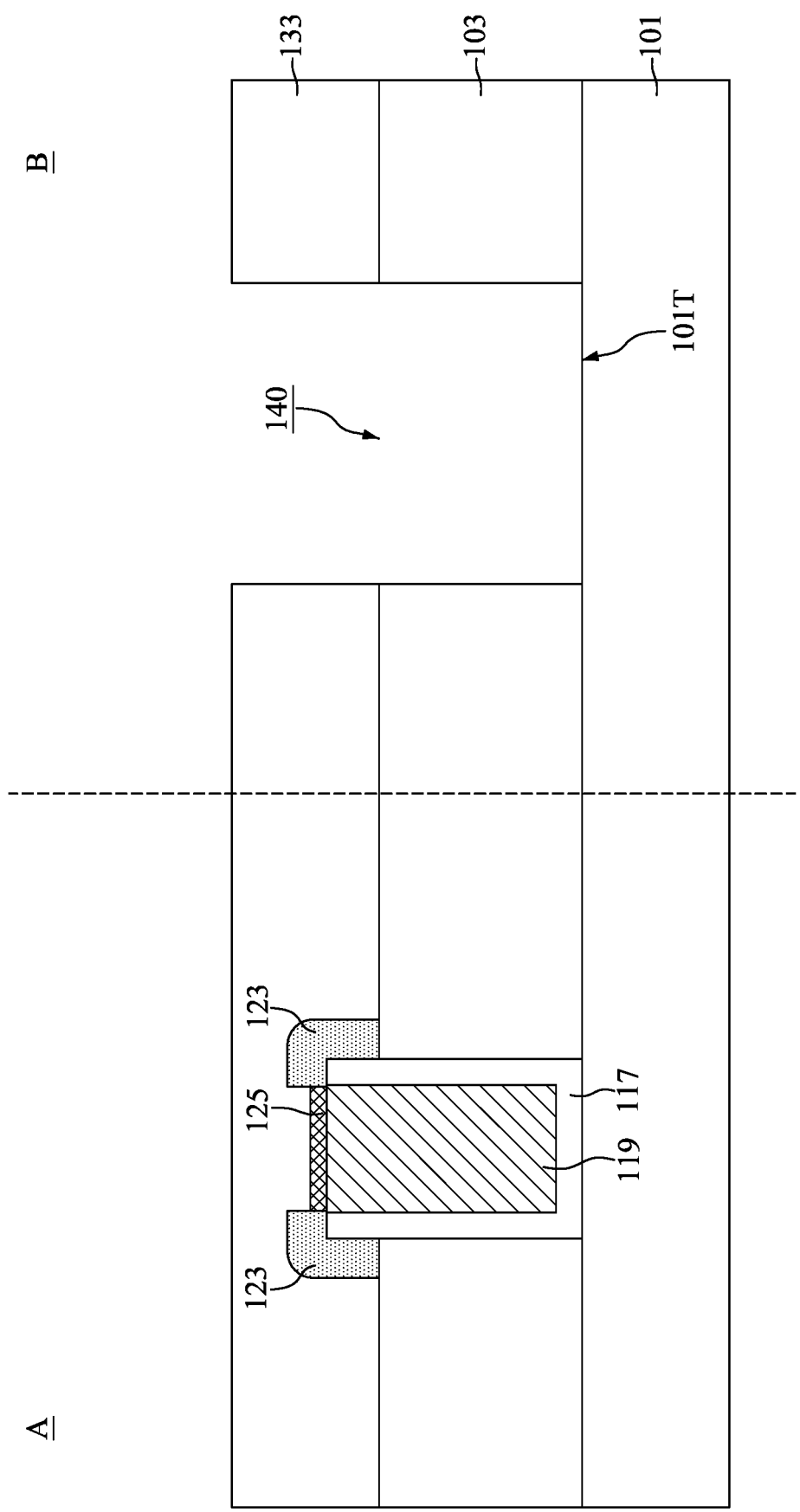
FIG. 10 is a cross-sectional view illustrating an intermediate stage of partially removing the first dielectric layer to form an opening in a peripheral circuit region during the formation of the semiconductor device, in accordance with some embodiments.

Next, a patterned mask 133 is formed over the first dielectric layer 103, and the inner silicide portion 125 and the outer silicide portion 123 are covered by the patterned mask 133, as shown in FIG. 10 in accordance with some embodiments. In some embodiments, the first dielectric layer 103 is etched by using the patterned mask 133 as a mask, such that an opening 140 is formed penetrating through the first dielectric layer 103 in the peripheral circuit region B. In other words, a portion of the top surface 101T of the semiconductor substrate 101 in the peripheral circuit region B is exposed by the opening 140. The opening 140 may be formed by a wet etching process, a dry etching process, or a combination thereof.

Figure 11:
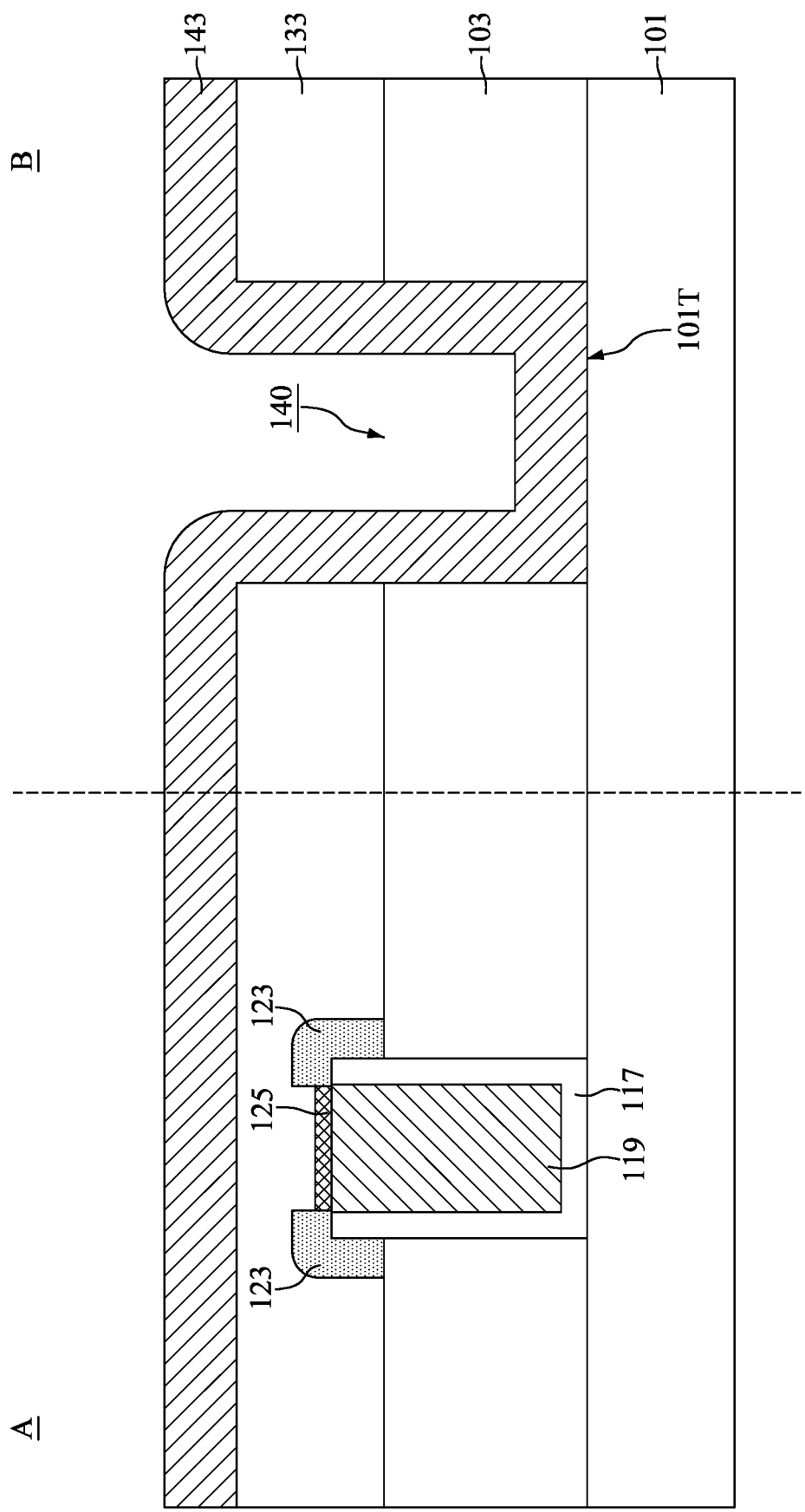
FIG. 11 is a cross-sectional view illustrating an intermediate stage of forming a metal material lining the opening of the peripheral circuit region during the formation of the semiconductor device, in accordance with some embodiments.

Subsequently, a metal material 143 is formed lining the opening 140, as shown in FIG. 11 in accordance with some embodiments. In some embodiments, the metal material 143 is formed to cover the portion of the top surface 101T of the semiconductor substrate 101 exposed by the opening 140, the sidewalls of the opening 140, and the top surface of the patterned mask 133. In some embodiments, the metal material 143 is made of tungsten (W), aluminum (Al), copper (Cu), titanium (Ti), tantalum (Ta), a combination thereof, or another applicable metal material. Moreover, the metal material 143 may be formed by a CVD process, a PVD process, an ALD process, an MOCVD process, a sputtering process, or another applicable process.

Figure 12:
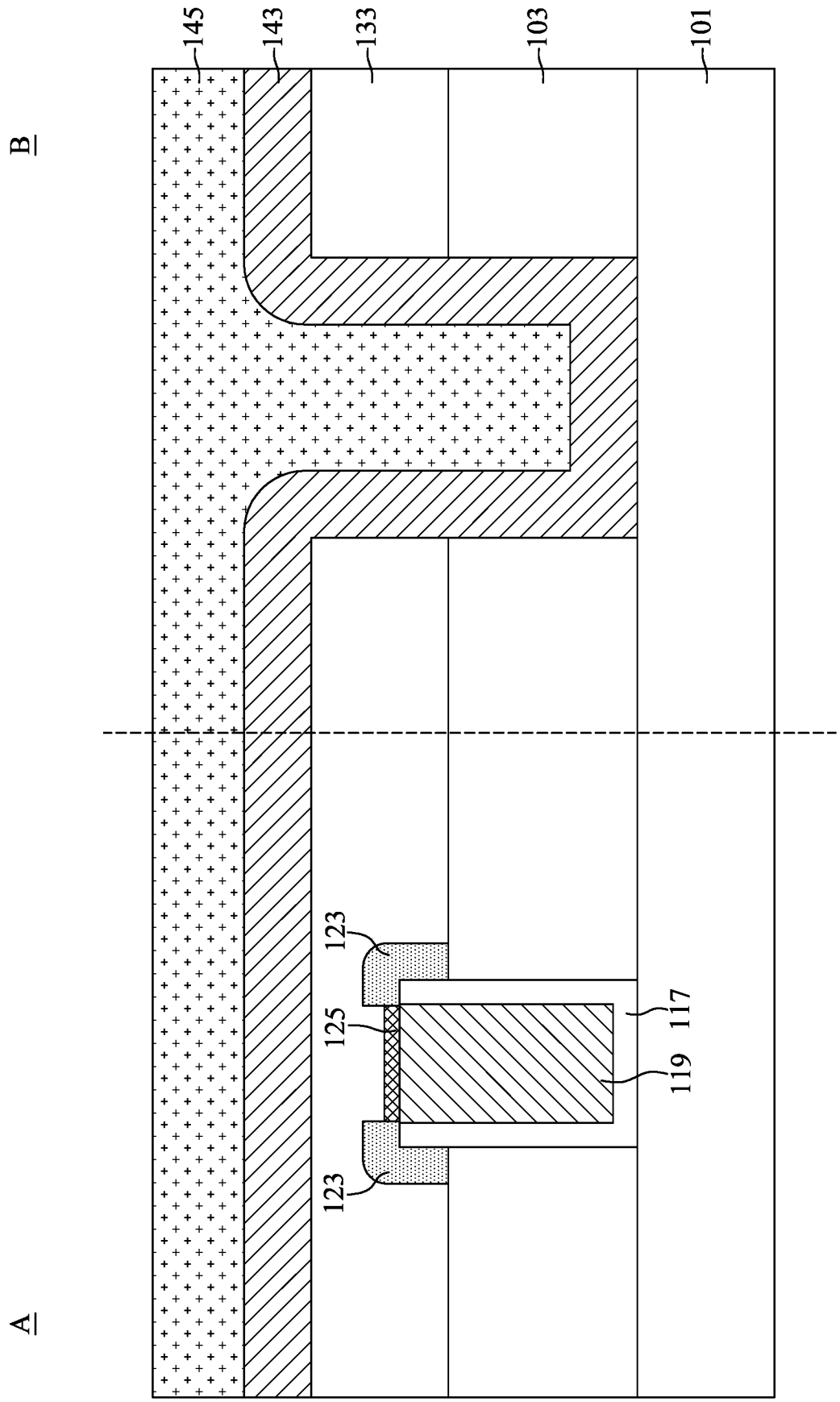
FIG. 12 is a cross-sectional view illustrating an intermediate stage of filling the opening of the peripheral circuit region with a dielectric material during the formation of the semiconductor device, in accordance with some embodiments.

Then, a dielectric material 145 is formed over the metal material 143 and filling the remaining portion of the opening 140, as shown in FIG. 12 in accordance with some embodiments. In some embodiments, the dielectric material 145 is made of silicon oxide, silicon nitride, silicon oxynitride, or another applicable dielectric material. Moreover, the dielectric material 145 may be formed by a CVD process, a PVD process, an ALD process, a spin-on coating process, or another applicable process.

After the dielectric material 145 is formed, a planarization process is performed on the dielectric material 145 and the metal material 143 to form the lower metal plug 147 and the dielectric pillar 149 in the opening 140 (See FIG. 10) of the peripheral circuit region B, as shown in FIGS. 13 and 14 in accordance with some embodiments. FIG. 13 is a cross-sectional view along the sectional line I-I' in the top view of FIG. 14. As shown in FIG. 14, the lower metal plug 147 and the dielectric pillar 149 are annular shaped from the top view, in accordance with some embodiments. The respective step is illustrated as the step S21 in the method 10 shown in FIG. 3.

In some embodiments, the planarization process is performed until the outer silicide portion 123 in the cell region A is exposed. The planarization process may include a CMP process, which removes the excess portions of the dielectric material 145, the metal material 143 and the patterned mask 133 over the outer silicide portion 123. In some embodiments, the outer silicide portion 123 may be slightly etched. In these cases, the topmost surface of the outer silicide portion 123 is still higher than the top surface 125T of the inner silicide portion 125, and a portion of the patterned mask 133 remains on the inner silicide portion 125.

In some embodiments, in the peripheral circuit region B, the lower metal plug 147 covers the sidewalls and the bottom surface of the dielectric pillar 149. That is, the lower metal plug 147 is a cup shaped metal structure filled with the dielectric pillar 149. In some embodiments, the top surface 147T of the lower metal plug 147 is substantially coplanar with the top surface 149T of the dielectric pillar 149.

Figure 15:
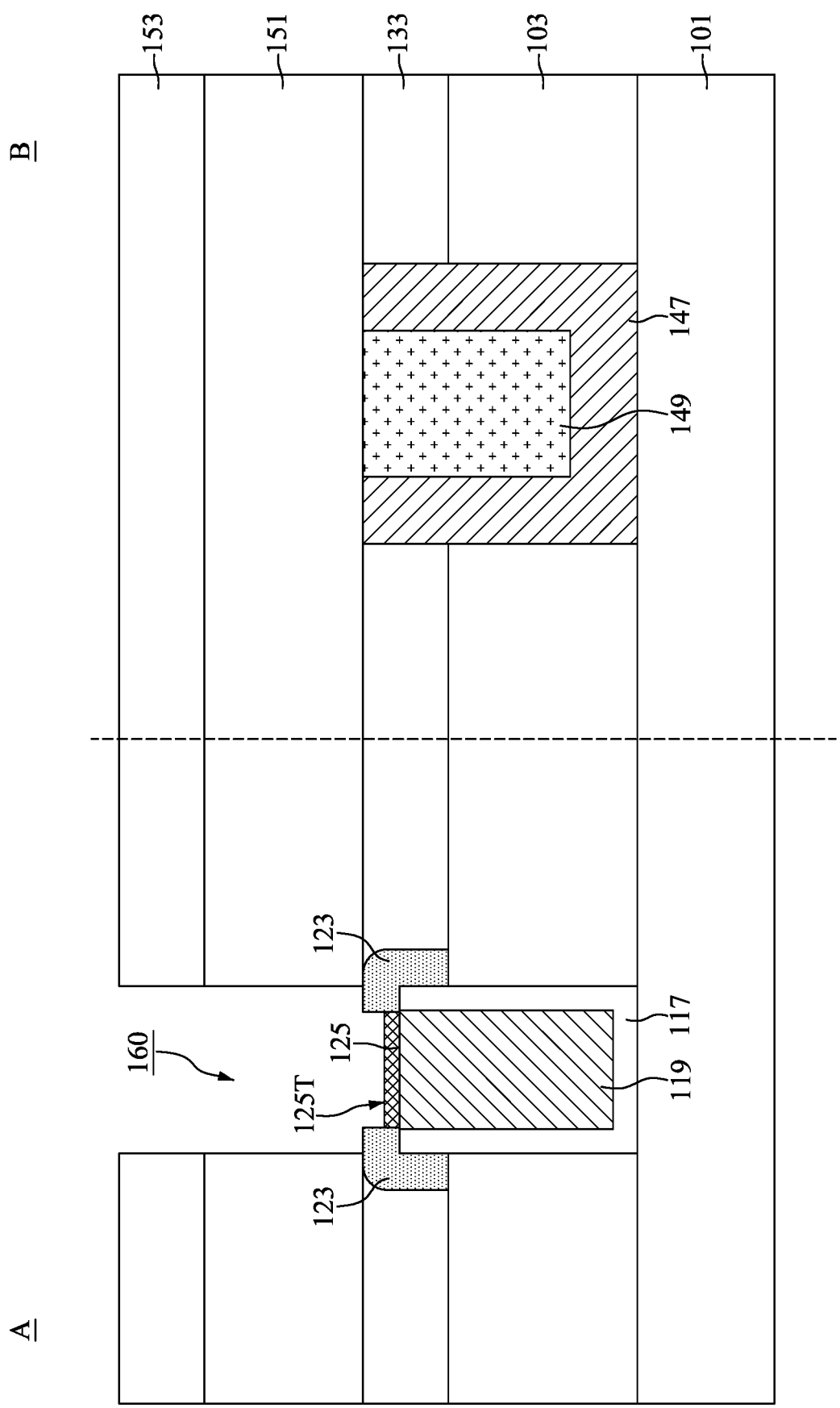
FIG. 15 is a cross-sectional view illustrating an intermediate stage of forming an opening over the lower metal plug of the cell region during the formation of the semiconductor device, in accordance with some embodiments.

Next, the second dielectric layer 151 is formed over the remaining portion of the patterned mask 133, and another patterned mask 153 is formed over the second dielectric layer 151, as shown in FIG. 15 in accordance with some embodiments. In some embodiments, the second dielectric layer 151 is etched by using the patterned mask 153 as a mask, such that an opening 160 is formed penetrating through the second dielectric layer 151 in the cell region A.

In some embodiments, the portion of the patterned mask 133 over the inner silicide portion 125 is removed, such that the top surface 125T of the inner silicide portion 125 is exposed by the opening 160. Moreover, the outer silicide portion 123 may be slightly etched during the etching process for preparing the opening 160. The opening 160 may be formed by a wet etching process, a dry etching process, or a combination thereof. After the opening 160 is formed, the patterned mask 153 may be removed.

Figure 16:
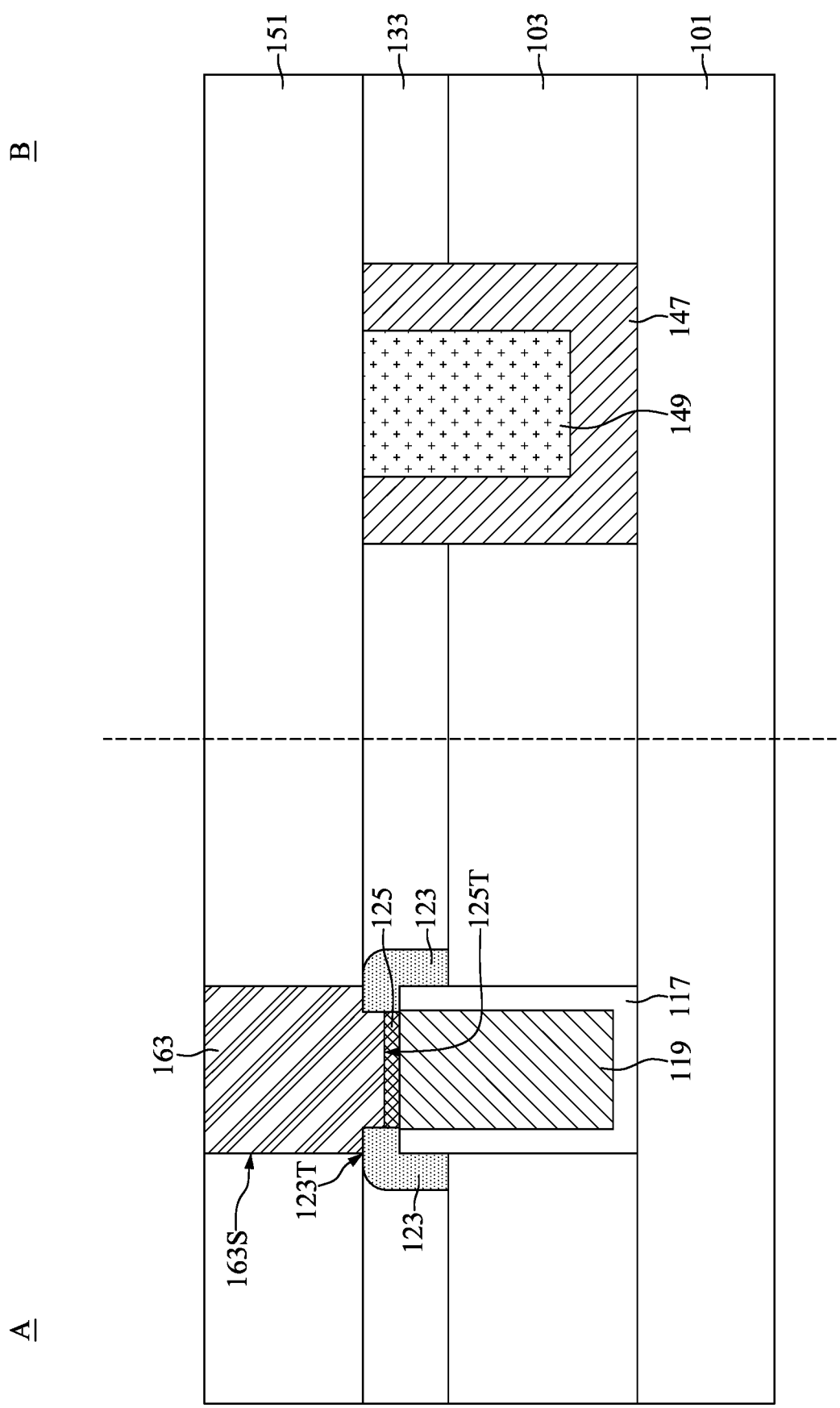
FIG. 16 is a cross-sectional view illustrating an intermediate stage of forming an upper metal plug over the lower metal plug of the cell region during the formation of the semiconductor device, in accordance with some embodiments.

Subsequently, the upper metal plug 163 is formed in the opening 160 (See FIG. 16) of the cell region A to directly contact the inner silicide portion 125 and the outer silicide portion 123, as shown in FIG. 16 in accordance with some embodiments. In some embodiments, the upper metal plug 163 is made of tungsten (W), aluminum (Al), copper (Cu), titanium (Ti), tantalum (Ta), a combination thereof, or another applicable metal material. The formation of the upper metal plug 163 may include a deposition process and a planarization process. The deposition process may be a CVD process, a PVD process, an ALD process, an MOCVD process, a sputtering process, a plating process, or another applicable process. The planarization process may include a CMP process.

Figure 17:
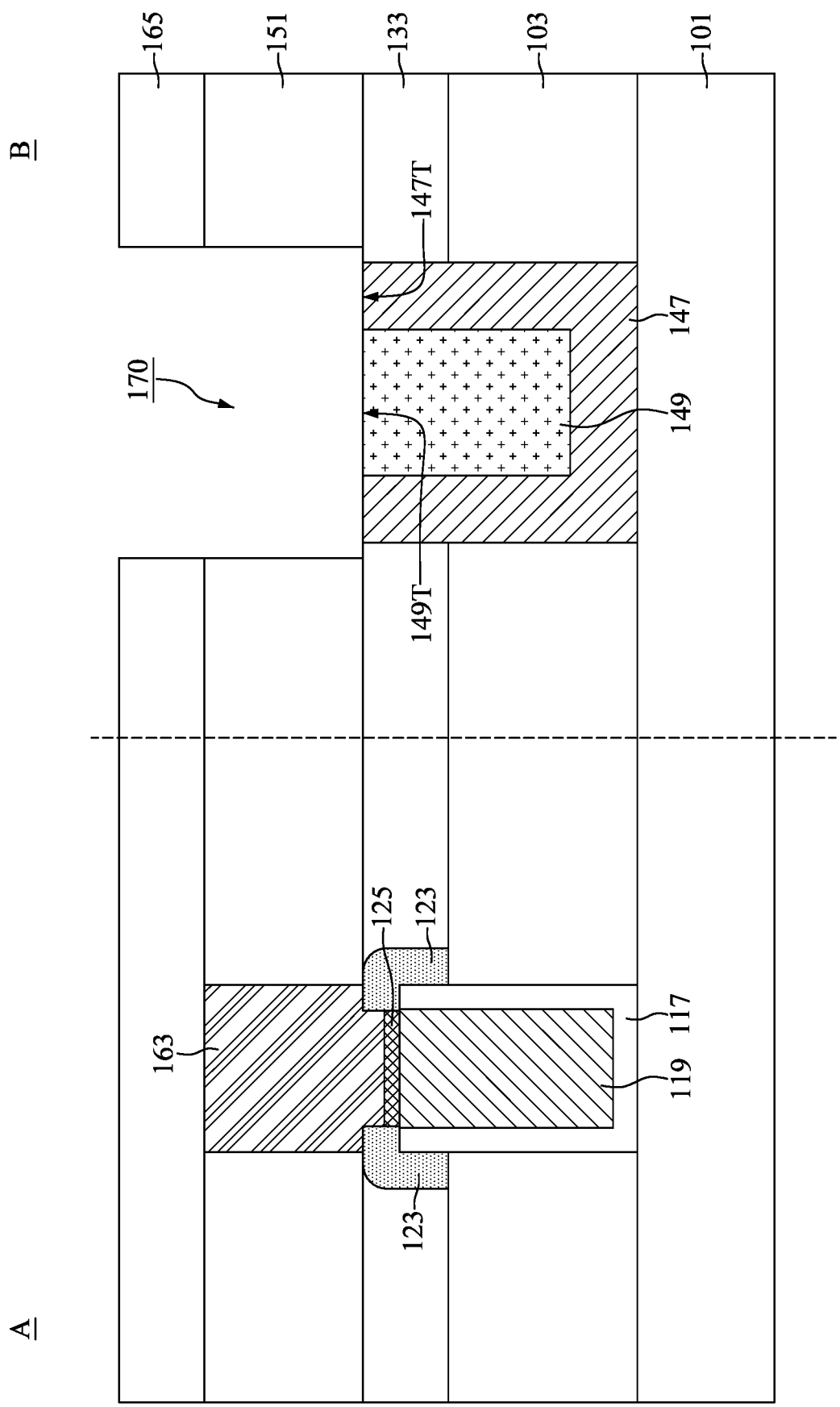
FIG. 17 is a cross-sectional view illustrating an intermediate stage of forming an opening over the lower metal plug of the peripheral circuit region during the formation of the semiconductor device, in accordance with some embodiments.

After the upper metal plug 163 is formed, a patterned mask 165 is formed over the second dielectric layer 151, as shown in FIG. 17 in accordance with some embodiments. In some embodiments, the second dielectric layer 151 is etched by using the patterned mask 165 as a mask, such that an opening 170 is formed penetrating through the second dielectric layer 151 in the peripheral circuit region B. In some embodiments, the top surface 149T of the dielectric pillar 149 and the top surface 147T of the lower metal plug 147 are exposed by the opening 170. The opening 170 may be formed by a wet etching process, a dry etching process, or a combination thereof. After the opening 170 is formed, the patterned mask 165 may be removed.

Then, referring back to FIG. 1, the upper metal plug 173 is formed in the opening 170 (See FIG. 17) of the peripheral circuit region B to directly contact the dielectric pillar 149 and the lower metal plug 147, in accordance with some embodiments. Some materials and processes used to form the upper metal plug 173 of the peripheral circuit region B are similar to, or the same as those used to form the upper metal plug 163 of the cell region A and details thereof are not repeated herein. The respective step is illustrated as the step S23 in the method 10 shown in FIG. 3.

In some other embodiments, the upper metal plug 163 of the cell region A and the upper metal plug 173 of the peripheral circuit region B are formed simultaneously. After the upper metal plugs 163 and 173 are formed, the semiconductor device 100 is obtained.

Figure 18:
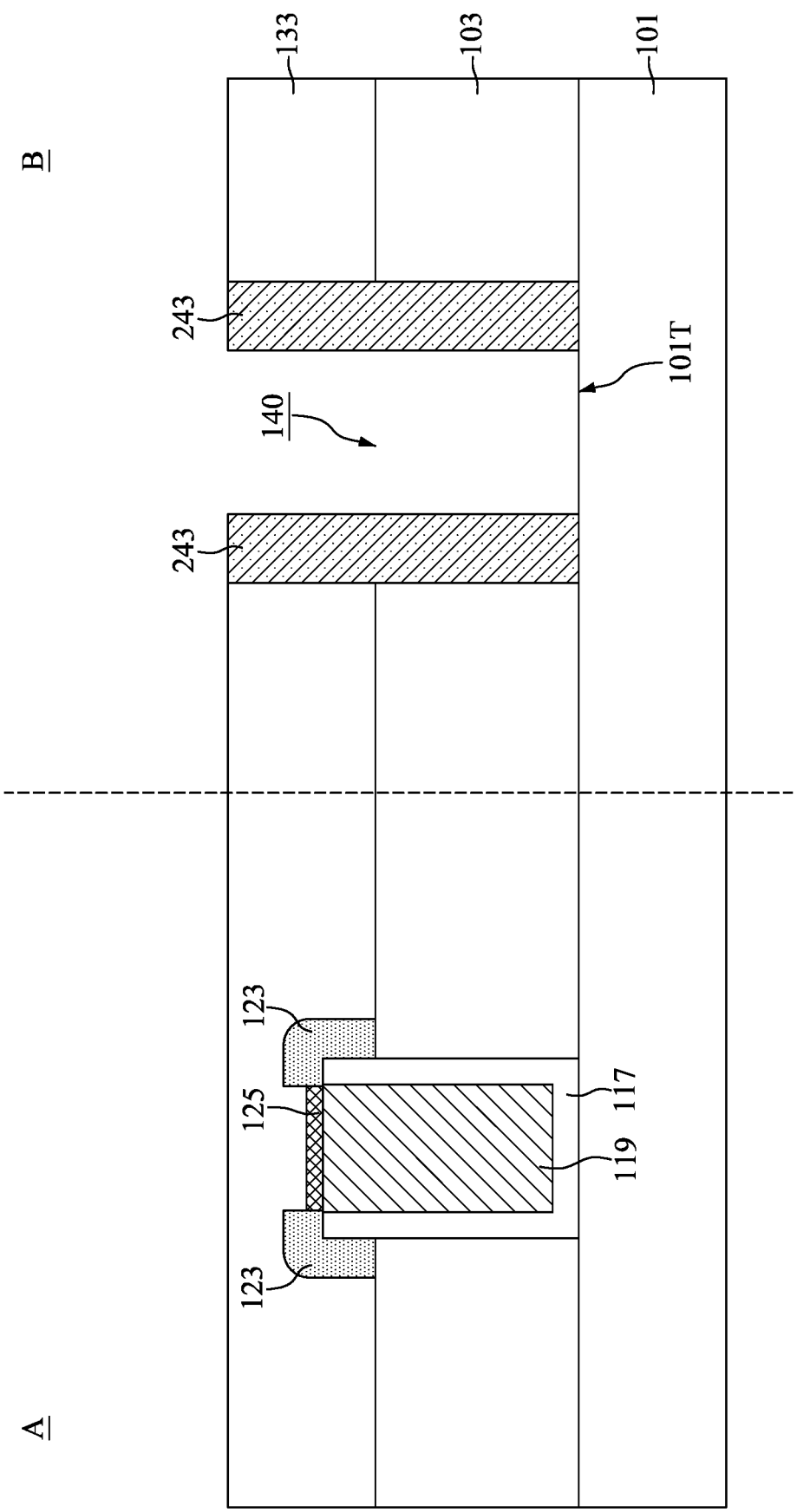
FIG. 18 is a cross-sectional view illustrating an intermediate stage of partially removing the metal material in the opening of the peripheral circuit region during the formation of the modified semiconductor device, in accordance with some embodiments.
Figure 19:
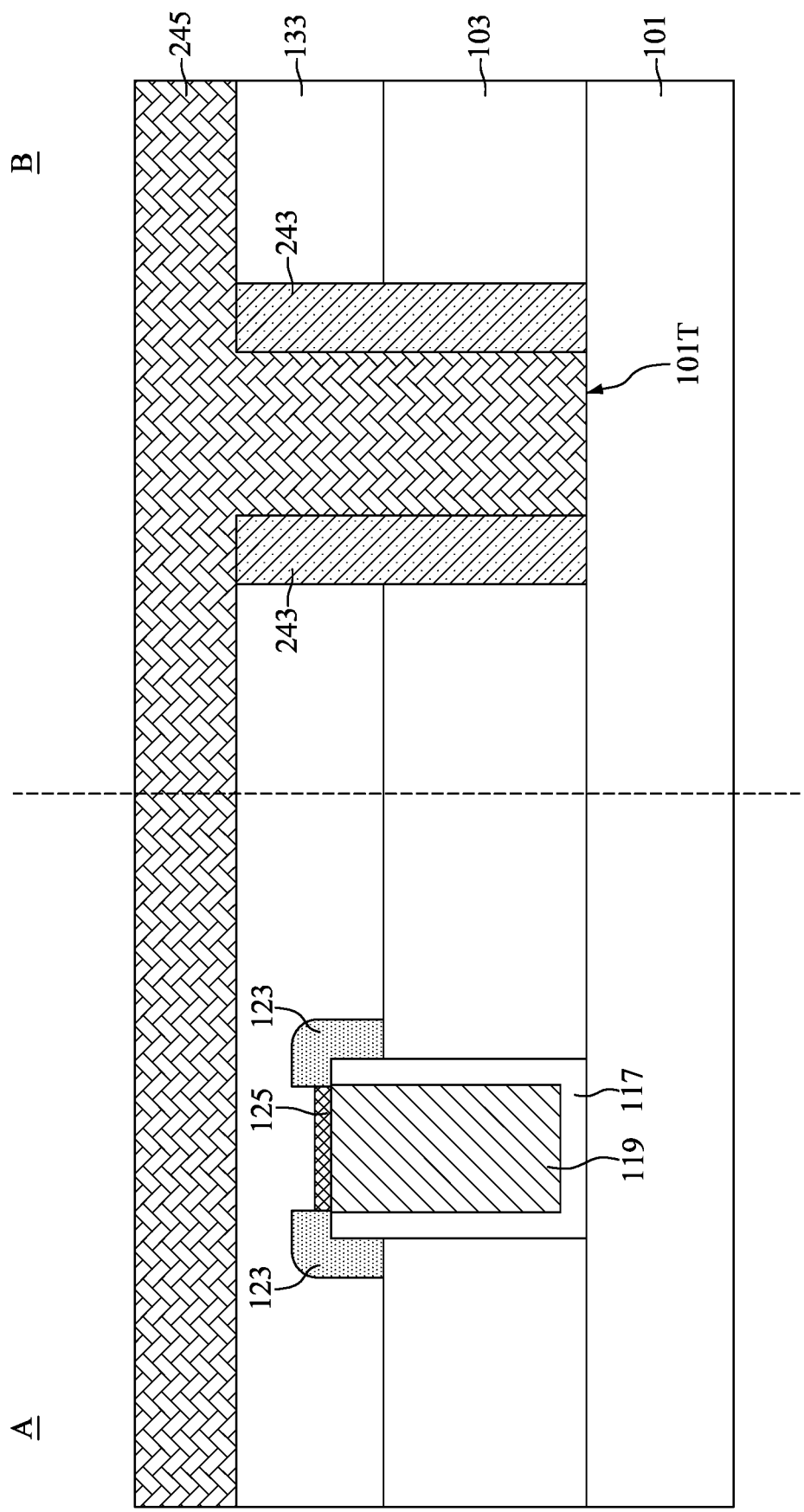
FIG. 19 is a cross-sectional view illustrating an intermediate stage of filling the opening of the peripheral circuit region with a dielectric material during the formation of the modified semiconductor device, in accordance with some embodiments.
Figure 20:
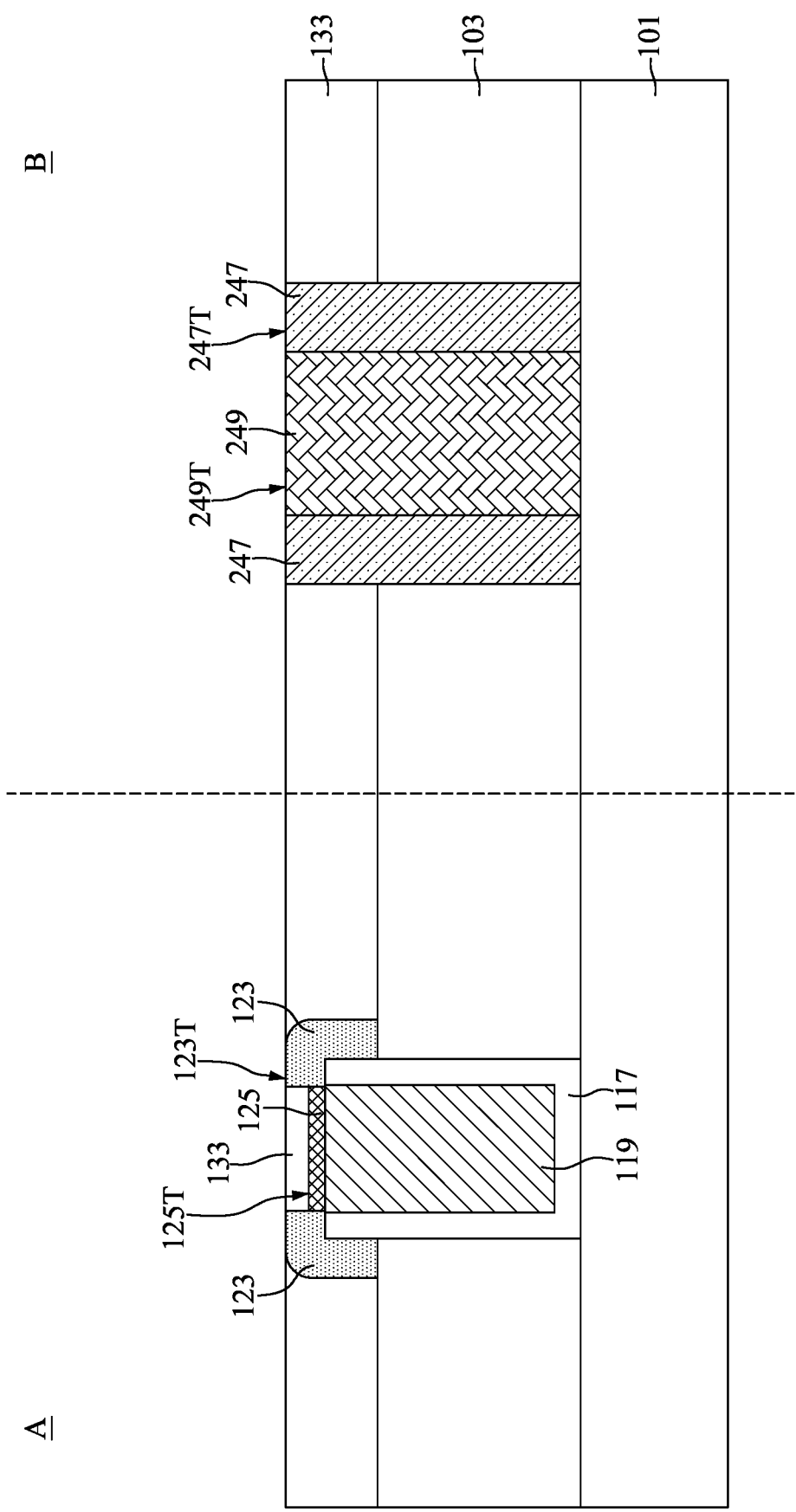
FIG. 20 is a cross-sectional view illustrating an intermediate stage of forming a lower metal plug and a dielectric pillar in the opening of the peripheral circuit region during the formation of the modified semiconductor device, in accordance with some embodiments.

FIGS. 18 to 20 are cross-sectional views illustrating intermediate stages of forming the modified semiconductor device 200, in accordance with some embodiments. After the metal material 143 is formed (i.e., following the step of FIG. 11), an etching process is performed on the metal material 143 to expose a portion of the top surface 101T of the semiconductor substrate 101, as shown in FIG. 18 in accordance with some embodiments. In some embodiments, an anisotropic etching process is performed on the metal material 143 to remove the same amount of the metal material 143 vertically in all places, leaving the metal spacer 243 (i.e., the vertical portion of the metal material 143) on the sidewalls of the opening 140. In some embodiments, the etching process is a dry etching process.

Subsequently, a dielectric material 245 is formed over the patterned mask 133 and the metal spacer 243, and the remaining portion of the opening 140 is filled by the dielectric material 245, as shown in FIG. 19 in accordance with some embodiments. Some materials and processes used to form the dielectric material 245 are similar to, or the same as those used to form the dielectric material 145 of FIG. 12, and details thereof are not repeated herein.

After the dielectric material 245 is formed, a planarization process is performed on the dielectric material 245 and the metal spacer 243 to form the lower metal plug 247 and the dielectric pillar 249 in the opening 140 (See FIG. 18) of the peripheral circuit region B, as shown in FIG. 20 in accordance with some embodiments. In some embodiments, the planarization process is performed until the outer silicide portion 123 of the cell region A is exposed. The planarization process may include a CMP process, which removes the excess portions of the dielectric material 245, the metal spacer 243 and the patterned mask 133 over the outer silicide portion 123. After the planarization process, the lower metal plug 247 is spacer shaped.

In some embodiments, in the peripheral circuit region B, the lower metal plug 247 covers the sidewalls of the dielectric pillar 249, and the bottom surface of the dielectric pillar 249 is in direct contact with the semiconductor substrate 101. In some embodiments, the top surface 247T of the lower metal plug 247 is substantially coplanar with the top surface 249T of the dielectric pillar 249.

Next, referring back to FIG. 2, the second dielectric layer 151 is formed over the structure of FIG. 20, and the upper metal plugs 163 and 173 are formed in the second dielectric layer 151. Some materials and processes used to form the second dielectric layer 151, the upper metal plugs 163 and 173 of modified semiconductor device 200 are similar to, or the same as those used to form the second dielectric layer 151, the upper metal plugs 163 and 173 of semiconductor device 100 and details thereof are not repeated herein. After the upper metal plugs 163 and 173 are formed, the modified semiconductor device 200 is obtained.

Figure 21:
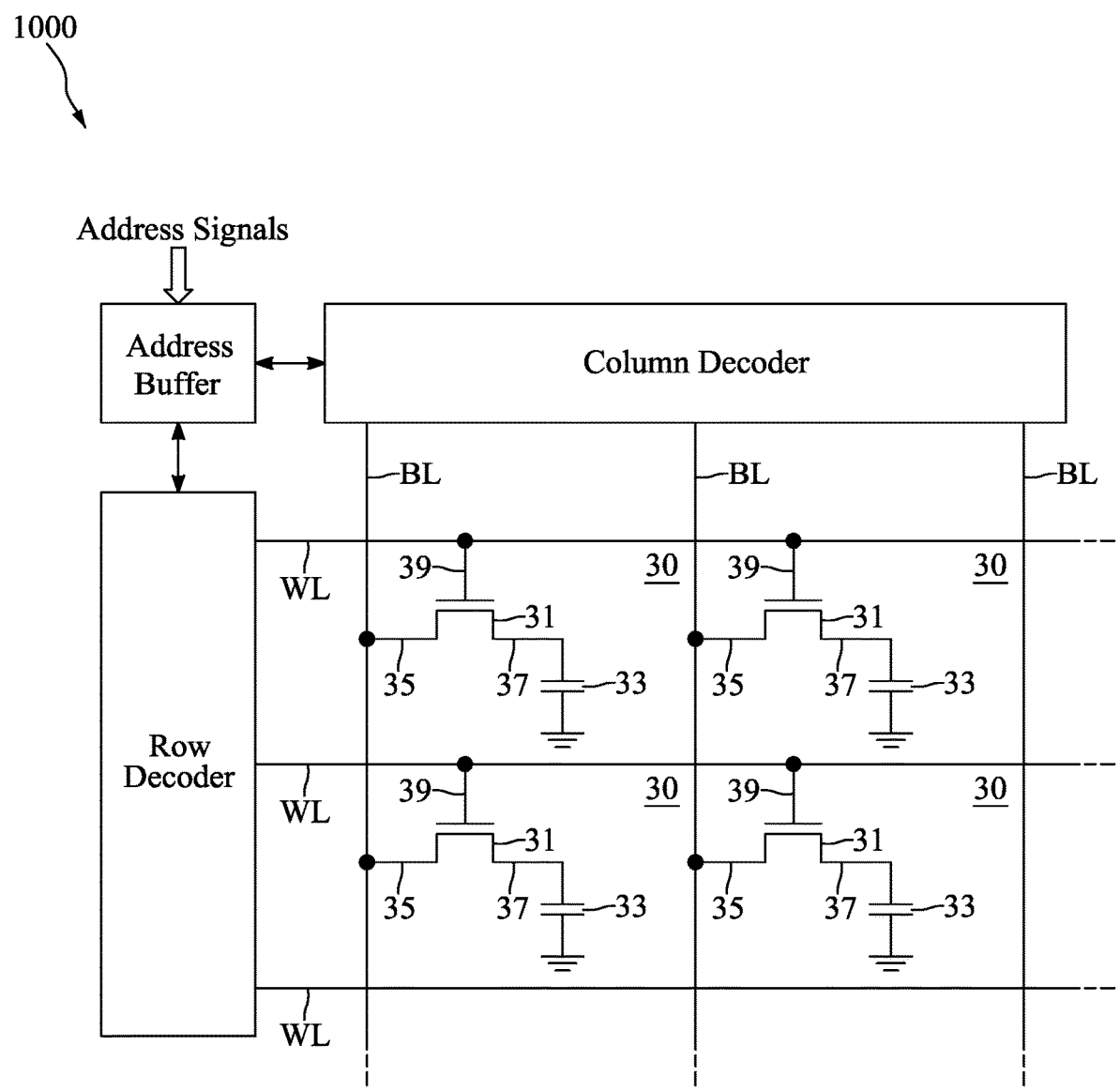
FIG. 21 is a partial schematic illustration of an exemplary integrated circuit, including an array of memory cells in accordance with some embodiments.

FIG. 21 is a partial schematic illustration of an exemplary integrated circuit, such as a memory device 1000, including an array of memory cells 30 in accordance with some embodiments. In some embodiments, the memory device 1000 includes a DRAM. In some embodiments, the memory device 1000 includes a number of memory cells 30 arranged in a grid pattern and including a number of rows and columns. The number of memory cells 30 may vary depending on system requirements and fabrication technology.

In some embodiments, each of the memory cells 30 includes an access device and a storage device. The access device is configured to provide controlled access to the storage device. In particular, the access device is a field effect transistor (FET) 31 and the storage device is a capacitor 33, in accordance with some embodiments. In each of the memory cells 30, the FET 31 includes a drain 35, a source 37 and a gate 39. One terminal of the capacitor 33 is electrically connected to the source 37 of the FET 31, and the other terminal of the capacitor 33 may be electrically connected to the ground. In addition, in each of the memory cells 30, the gate 39 of the FET 31 is electrically connected to a word line WL, and the drain 35 of the FET 31 is electrically connected to a bit line BL.

The above description mentions the terminal of the FET 31 electrically connected to the capacitor 33 is the source 37, and the terminal of the FET 31 electrically connected to the bit line BL is the drain 35. However, during read and write operations, the terminal of the FET 31 electrically connected to the capacitor 33 may be the drain, and the terminal of the FET 31 electrically connected to the bit line BL may be the source. That is, either terminal of the FET 31 could be a source or a drain depending on the manner in which the FET 31 is being controlled by the voltages applied to the source, the drain and the gate.

By controlling the voltage at the gate 39 via the word line WL, a voltage potential may be created across the FET 30 such that the electrical charge can flow from the drain 35 to the capacitor 33. Therefore, the electrical charge stored in the capacitor 33 may be interpreted as a binary data value in the memory cell 30. For example, a positive charge above a threshold voltage stored in the capacitor 33 may be interpreted as binary "1." If the charge in the capacitor 33 is below the threshold value, a binary value of "0" is said to be stored in the memory cell 30.

The bit lines BL are configured to read and write data to and from the memory cells 30. The word lines WL are configured to activate the FET 31 to access a particular row of the memory cells 30. Accordingly, the memory device 1000 also includes a periphery circuit region which may include an address buffer, a row decoder and a column decoder. The row decoder and the column decoder selectively access the memory cells 30 in response to address signals that are provided to the address buffer during read, write and refresh operations. The address signals are typically provided by an external controller such as a microprocessor or another type of memory controller.

Referring back to FIGS. 1 and 2, the composite landing pad (i.e., the inner silicide portion 125 and the outer silicide portion 123) is formed in the cell region A of the semiconductor devices 100 and 200. The cell region A may be any of the regions of the memory cells 30 in the memory device 1000, and the peripheral circuit region B may be any of the regions of the address buffer, the row decoder, or the column decoder in the memory device 1000.

Embodiments of the semiconductor devices 100 and 200 are provided in the disclosure. In the cell region A, the lower metal plug 119 and the barrier layer 117 are disposed over the semiconductor substrate 101, and the lower metal plug 119 is surrounded by the barrier layer 117. Moreover, the inner silicide portion 125 is disposed over the lower metal plug 119, and the outer silicide portion 123 is disposed over the barrier layer 117. The inner silicide portion 125 and the outer silicide portion 123 constitute a composite landing pad with an increased landing area for the upper metal plug 163 to land on. Therefore, the contact resistance may be reduced, and the misalignment issues between the lower metal plug 119 and the upper metal plug 163 may be prevented or reduced. As a result, the overall device performance may be improved, and the yield rate of the semiconductor device may be increased. In addition, since the composite landing pad is formed by the salicide process, the associated costs may be reduced.

In one embodiment of the present disclosure, a method for preparing a semiconductor device is provided. The method includes forming a first dielectric layer over a semiconductor substrate. The method also includes forming a barrier layer and a first lower metal plug penetrating through the first dielectric layer and in a cell region. The first lower metal plug is surrounded by the barrier layer. The method further includes depositing a silicon layer over the first dielectric layer, the barrier layer and the first lower metal plug. In addition, the method includes performing a salicide process to form an inner silicide portion over the first lower metal plug and an outer silicide portion over the barrier layer after the silicon layer is formed. The inner silicide portion is surrounded by the outer silicide portion, and a recess is formed over the inner silicide portion.

The embodiments of the present disclosure have some advantageous features. By forming a composite landing pad over a lower metal plug, an increased landing area for a subsequent upper metal plug is obtained. As a result, the overall device performance may be improved, and the yield rate of the semiconductor device may be increased. Moreover, since the composite landing pad is formed by a salicide process, the associated costs may be reduced.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for preparing a semiconductor device, comprising:
    forming a first dielectric layer over a semiconductor substrate;
    forming a barrier layer and a first lower metal plug penetrating through the first dielectric layer and in a cell region, wherein the first lower metal plug is surrounded by the barrier layer;
    depositing a silicon layer over the first dielectric layer, the barrier layer and the first lower metal plug; and
    performing a salicide process to form an inner silicide portion over the first lower metal plug and an outer silicide portion over the barrier layer after the silicon layer is formed, wherein the inner silicide portion is surrounded by the outer silicide portion, and a recess is formed over the inner silicide portion.

2. The method for preparing a semiconductor device of claim 1, wherein forming the barrier layer and the first lower metal plug comprises:
    etching the first dielectric layer to form a first opening in the cell region;
    forming a barrier material lining the first opening;
    forming a first metal material over the barrier material; and
    planarizing the first metal material and the barrier material to form the first lower metal plug and the barrier layer in the first opening.

3. The method for preparing a semiconductor device of claim 2, further comprising:
    partially removing the first dielectric layer to expose an upper sidewall of the barrier layer before the silicon layer is deposited.

4. The method for preparing a semiconductor device of claim 3, wherein the upper sidewall of the barrier layer is covered by the silicon layer before the salicide process is performed.

5. The method for preparing a semiconductor device of claim 1, further comprising:
    etching the first dielectric layer to form a second opening in a peripheral circuit region, wherein a top surface of the semiconductor substrate is exposed by the second opening;
    forming a second metal material lining the second opening and covering the top surface of the semiconductor substrate;
    forming a dielectric material over the second metal material; and
    planarizing the second metal material and the dielectric material to form a second lower metal plug and a dielectric pillar surrounded by the second lower metal plug.

6. The method for preparing a semiconductor device of claim 5, further comprising:
    forming a second dielectric layer over the first dielectric layer;

forming a first upper metal plug penetrating through the second dielectric layer and contacting the inner silicide portion and the outer silicide portion; and forming a second upper metal plug penetrating through the second dielectric layer and contacting the second lower metal plug and the dielectric pillar.

7. The semiconductor device of claim 5, further comprising:

partially removing the second metal material to expose a portion of the top surface of the semiconductor substrate before the dielectric material is formed.

8. The method for preparing a semiconductor device of claim 5, wherein the barrier layer is made of a titanium-containing material, and the outer silicide portion is made of a titanium-containing silicide.

9. The method for preparing a semiconductor device of claim 8, wherein the first lower metal plug and the barrier layer protrude from a top surface of the first dielectric layer, and an upper sidewall of the barrier layer is covered by the outer silicide portion.

10. The method for preparing a semiconductor device of claim 8, wherein the top surface of the inner silicide portion is in direct contact with a bottom surface of the first upper metal plug.

11. The method for preparing a semiconductor device of claim 10, wherein the top surface of the outer silicide portion is in direct contact with a sidewall of the first upper metal plug.

12. The method for preparing a semiconductor device of claim 11, wherein a sidewall of the upper metal plug is partially covered by the outer silicide portion.

13. The method for preparing a semiconductor device of claim 12, wherein the dielectric pillar is separated from the semiconductor substrate by the second lower metal plug.

14. The method for preparing a semiconductor device of claim 12, wherein the dielectric pillar is in direct contact with the semiconductor substrate.

\* \* \* \* \*